(12) United States Patent
Shiratori et al.

(10) Patent No.: US 9,972,808 B2
(45) Date of Patent: May 15, 2018

(54) DISPLAY DEVICE HAVING A SUBSTRATE WITH A POLYGONAL DISPLAY AREA AND AN ELECTRONIC APPARATUS

(71) Applicant: SEIKO EPSON CORPORATION, Tokyo (JP)

(72) Inventors: Koya Shiratori, Matsumoto (JP); Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days. days.

(21) Appl. No.: 14/607,930

(22) Filed: Jan. 28, 2015

(65) Prior Publication Data
US 2015/0243932 A1    Aug. 27, 2015

(30) Foreign Application Priority Data
Feb. 25, 2014  (JP) ................. 2014-033782

(51) Int. Cl.
*H01L 29/18* (2006.01)
*H01L 33/00* (2010.01)
*H01L 51/52* (2006.01)

(52) U.S. Cl.
CPC ........ *H01L 51/5271* (2013.01); *H01L 51/524* (2013.01); *H01L 51/5265* (2013.01); *H01L 51/5275* (2013.01); *H01L 51/5284* (2013.01); *H01L 2251/5315* (2013.01); *H01L 2251/558* (2013.01)

(58) Field of Classification Search
CPC ....... H01L 2251/5315; H01L 2251/558; H01L 51/524; H01L 51/5271; H01L 51/5275; H01L 51/5284
See application file for complete search history.

(56) References Cited

U.S. PATENT DOCUMENTS

| | | | |
|---|---|---|---|
| 2003/0092213 A1* | 5/2003 | Yamazaki | ............... H01L 27/12 438/48 |
| 2005/0242709 A1 | 11/2005 | Yamauchi | |
| 2006/0028125 A1 | 2/2006 | Kim et al. | |
| 2008/0194166 A1 | 8/2008 | Yamauchi | |
| 2008/0219005 A1* | 9/2008 | Fukuda | ............... H01L 51/5271 362/284 |
| 2009/0102758 A1 | 4/2009 | Anzai et al. | |
| 2011/0062855 A1 | 3/2011 | Tanaka et al. | |

(Continued)

FOREIGN PATENT DOCUMENTS

| | | |
|---|---|---|
| JP | H11283745 A | 10/1999 |
| JP | 2005-317438 A | 11/2005 |

(Continued)

*Primary Examiner* — Ismail Muse
(74) *Attorney, Agent, or Firm* — Oliff PLC

(57) ABSTRACT

There is provided a display device including an element substrate that has a display area; and a counter substrate. When it is assumed that the length of the shortest edge of the display area is X1, the length of a longest diagonal line of the display area is X3, the thickness of the counter substrate is L1, the refraction index of the counter substrate is n1, the refractive index of the air is n2, and the minimum value of an angle, which is generated between a progress direction of light emitted from the organic EL elements and a normal vector direction is totally reflected in the surface, is α, the relationship of $X1/(2 \tan \alpha) \leq L1 \leq X3/(\tan \alpha)$ is realized.

21 Claims, 12 Drawing Sheets

(56) References Cited

U.S. PATENT DOCUMENTS

| | | |
|---|---|---|
| 2011/0080088 A1 | 4/2011 | Hara et al. |
| 2012/0038267 A1 | 2/2012 | Hanamura et al. |
| 2012/0194894 A1* | 8/2012 | Yashiro ............... C07D 213/38 359/270 |
| 2013/0020932 A1 | 1/2013 | Tanaka et al. |
| 2013/0050605 A1* | 2/2013 | Moriwaki ............. G02F 1/1339 349/43 |
| 2013/0164486 A1 | 6/2013 | Yamada et al. |
| 2013/0279017 A1* | 10/2013 | Amitai ................ G02B 6/0055 359/633 |
| 2017/0178563 A1 | 6/2017 | Anzai et al. |

FOREIGN PATENT DOCUMENTS

| | | |
|---|---|---|
| JP | 2006049308 A | 2/2006 |
| JP | 2007-207655 A | 8/2007 |
| JP | 2009-134246 A | 6/2009 |
| JP | 2011-081945 A | 4/2011 |
| JP | 2011-086616 A | 4/2011 |
| JP | 2012038677 A | 2/2012 |
| JP | 2012-209116 A | 10/2012 |
| JP | 2014-011082 A | 1/2014 |
| WO | 2011158873 A1 | 12/2011 |

* cited by examiner

DISPLAY DEVICE HAVING A SUBSTRATE WITH A POLYGONAL DISPLAY AREA AND AN ELECTRONIC APPARATUS

BACKGROUND

1. Technical Field

The present invention relates to a self-luminous display device and an electronic apparatus including the display device.

2. Related Art

For example, an organic EL device in which pixels having transistors and organic electro-luminescence (hereinafter, referred to as an organic EL) elements are arranged in a matrix shape has been proposed as an example of a display device (JP-A-2012-38677).

In the organic EL device disclosed in JP-A-2012-38677, a reflection layer, a reflection layer protection layer (insulation film), an organic EL element, a protection layer, a color filter, a light-transmitting counter substrate, and the like are laminated in order on a substrate on which transistors are formed. The organic EL element includes a pixel electrode, a light emitting function layer, and a cathode which are laminated in order from a side of the insulation film. The organic EL device has an optical resonance structure in which the optical distance between the reflection layer and the cathode is optimized. Light (red color light, green color light, and blue color light), the color purity of which is increased by the multi-reflection interference of reflected light, passes through color filters and is emitted from the side of the counter substrate as display light. As a result, color display which has excellent color purity is provided.

In the organic EL device disclosed in JP-A-2012-38677, red color light, green color light, and blue color light are extracted from light emitted from the organic EL elements based on the optical resonance structure, and thus it is possible to acquire color display while omitting the color filters and it is possible to increase the brightness of display by omitting the color filters.

However, when the color filters are omitted from the organic EL device disclosed in JP-A-2012-38677, some of light emitted from the organic EL elements is reflected between the counter substrate and the reflection layer, and thus there is a problem in that display qualities are deteriorated.

Hereinafter, the details will be described with reference to FIGS. 11 to 12B.

FIG. 11 is a schematic diagram illustrating an organic EL device according to a well-known technology. FIGS. 12A and 12B are typical cross-sectional diagrams taken along line XII-XII of FIG. 11. In FIG. 12A, the state of light emitted from the organic EL elements is schematically illustrated. In FIG. 12B, a state of light corresponding to a display of FIG. 11 is schematically illustrated.

An organic EL device 500 includes a structure in which a color filter layer is omitted from the organic EL device disclosed in JP-A-2012-38677. As illustrated in FIG. 11, the organic EL device 500 includes an element substrate 510 and a counter substrate 530 which is arranged to face the element substrate 510. The counter substrate 530 is formed of, for example, glass, and has transparency. The refractive index n1 of the counter substrate 530 is 1.46.

The organic EL device 500 includes a display area V in which a plurality of pixels are arranged. There is a case in which, when a pattern 551 is displayed in an area Z1 of the display area V, a pattern 552 is displayed in an area Z2 which is separated from the area Z1, and a pattern 553 is displayed in an area Z3 which is separated from the area Z2.

Hereinafter, it is assumed that a direction along the long side of the element substrate 510 is an X direction, a direction along the short side of the element substrate 510 is a Y direction, and a direction which faces the counter substrate 530 from the substrate 510 is a Z direction.

Initially, the structure of the organic EL device 500 and the state of light which is emitted from the organic EL device 500 will be described with reference to FIG. 12A.

As shown in FIG. 12A, in the organic EL device 500, the element substrate 510, a resin layer 520, and the counter substrate 530 are sequentially arranged in the Z direction. The resin layer 520 is formed of, for example, an epoxy resin, and bonds the element substrate 510 to the counter substrate 530.

The air 601 is arranged on a surface 530a which is an opposite side of a surface of the counter substrate 530 which faces the element substrate 510. The refractive index n2 of the air 601 is approximately 1.

The element substrate 510 includes a substrate 511, a reflection layer 512, a reflection layer protection layer (insulation film) 512a, an organic EL element 513, and a protection film 514 which are sequentially arranged on the substrate 511 in the Z direction. A transistor (not shown in the drawing) which drives the organic EL element 513, a drive circuit (not shown in the drawing), and the like are formed on the substrate 511. The protection film 514 is a passivation film which suppresses the deterioration of the organic EL element 513 and has transparency. The reflection layer 512, the insulation film 512a, and the organic EL element 513 form the optical resonance structure. Red color light, green color light, and blue color light, which are emitted from the light emission layer of the organic EL element 513 and the color purities of which are increased by the multi-reflection interference of the reflected light in the optical resonance structure, are emitted in the Z direction as the display light.

Light LB1, which is emitted from the light emission layer of the organic EL element 513 and the color purity of which is increased by the optical resonance structure, is incident to the surface 530a of the counter substrate 530. Some of the light LB1 are reflected in the boundary surface (surface 530a) between the counter substrate 530 and the air 601 and are ejected on the side of the air 601 as light LB2. Some of the light LB1 are reflected in the surface 530a and are progressed on the side of the reflection layer 512 as light LB3.

Hereinafter, the light LB1 is called incident light LB1, the light LB2 is called refracted light LB2, and the light LB3 is called reflected light LB3.

When it is assumed that an angle generated between the incident light LB1 and the normal vector (Z direction) of the surface 530a is set to θ1 and an angle generated between the progress direction of the refracted light LB2 and the Z direction is set to θ2, Expression (1) described below is realized based on Snell's law.

$$n1 \sin \theta1 = n2 \sin \theta2 \qquad (1)$$

The angle θ1 generated between the progress direction of the incident light LB1 and the Z direction based on Expression (1) is expressed using Expression (2) described below.

$$\theta1 = \sin^{-1}((n2 \sin \theta2)/n1) \qquad (2)$$

A condition in which the angle θ2 generated between the progress direction of the refracted light LB2 and the Z direction is greater than 90° corresponds to a condition in which the incident light LB1 does not progress at the side of the air 601, that is, a condition in which all of the incident light LB1 are reflected in the surface 530a. Therefore, the angle θ1 acquired when the angle θ2 is 90° is a critical angle α at which the incident light LB1 is totally reflected in the surface 530a.

When the angle θ1 generated between the progress direction of the incident light LB1 and the Z direction is less than the critical angle α, the incident light LB1 is divided into the refracted light LB2 and the reflected light LB3 in the surface 530a. When the angle θ1 generated between the progress direction of the incident light LB1 and the Z direction is equal to or greater than the critical angle α, the incident light LB1 is totally reflected in the surface 530a and becomes the reflected light LB3. Therefore, when the angle θ1 generated between the progress direction of the incident light LB1 and the Z direction is equal to or greater than the critical angle α, the brightness of the reflected light LB3 is the highest.

In contrast, the wavelength of light which is amplified by the above-described optical resonance structure changes according to the direction of light which passes through the optical resonance structure. More specifically, with regard to light which passes through the optical resonance structure in an oblique direction (direction perpendicular to the Z direction), the intensity of light on a short wavelength side increases compared to the light which passes through the optical resonance structure in the Z direction. Therefore, when the angle θ1 generated between the progress direction of the incident light LB1 and the Z direction becomes large, the wavelength of enhanced light changes to a short wavelength side. For example, when the intensity of light in a blue color wavelength region increases under a condition that the angle θ1 based on the Z direction is 0°, the intensity of light on a short wavelength side rather than the blue color wavelength region, that is, light in a wavelength region which is difficult to be recognized by human eyes increases under a condition that the angle θ1 based on the Z direction is greater than 0°.

That is, when the angle θ1 generated between the progress direction of the incident light LB1 and the Z direction is greater than the critical angle α, the wavelength of the incident light LB1 which is enhanced by the optical resonance structure changes to the short wavelength side, and thus it is difficult to be recognized by human eyes. Therefore, the incident light LB1 under the condition that an angle based on the Z direction is the critical angle α is easily recognized by human eyes and is easily conspicuous rather than the incident light LB1 under the condition that the angle based on the Z direction is greater than the critical angle α. Therefore, the incident light LB1 under the condition that the angle based on the Z direction is the critical angle α affects the display of the above-described pattern 552 and the pattern 553 most.

Subsequently, a cause of the display of the pattern 552 and the pattern 553 subsequent to the display of the necessary pattern 551 will be described with reference to FIG. 12B. In addition, it is assumed that light M1, M2, and M3 ejected in the Z direction are viewed as display light in the drawing.

As shown in FIG. 12B, the light M1 is ejected in the Z direction from the organic EL element 513 in the area Z1, and thus the necessary pattern 551 is displayed.

Light in a direction which is perpendicular to the Z direction is also ejected from the organic EL element 513 in the area Z1 other than the light M1 in the Z direction. From among light ejected in the direction which is perpendicular to the Z direction, the incident light LB1 in which the angle based on the Z direction is the critical angle α is totally reflected in the surface 530a and faces the side of the reflection layer 513 as the reflected light LB3.

The reflected light LB3 progresses to the side of the reflection layer 512 and is reflected in the reflection layer 512 of the area Z2. The reflection layer 512, which is formed on the substrate 511 on which transistors, drive circuits, and the like are formed, includes various types of unevenness, and the reflected light LB3 is reflected in various directions. The pattern 552 is formed by the light M2 in the Z direction from among light reflected in the reflection layer 512 of the area Z2.

Further, from among light reflected in the reflection layer 512 of the area Z2, incident light LB1a, in which the angle based on the Z direction is in the vicinity of the critical angle α, progresses to the side of the surface 530a, is totally reflected in the surface 530a, and progresses to the side of the reflection layer 513 as reflected light LB3a. The reflected light LB3a is reflected in the reflection layer 512 of the area Z3. The pattern 553 is displayed by the light M3 which faces the Z direction from among light reflected in the reflection layer 512 of the area Z3.

Further, the display states of the pattern 552 and the pattern 553 change according to the directivity of light reflected in the reflection layer 512 (the reflection performance of the reflection layer 512).

For example, when light is reflected in the reflection layer 512 in the X direction, the pattern 552 and the pattern 553 are displayed after being arranged in the X direction as shown in FIG. 11. For example, when light is reflected in the reflection layer 512 in the Y direction, the pattern 552 and the pattern 553 are displayed after being arranged in the Y direction. For example, when light is reflected in the reflection layer 512 in a direction (oblique direction) which is perpendicular to the X direction and the Y direction, the pattern 552 and the pattern 553 are displayed after being arranged in the oblique direction. For example, when light is reflected in the reflection layer 512 while being spread in the X direction, the pattern 552 and the pattern 553 are displayed in a wide range compared to the display state shown in FIG. 11.

For example, when the reflection layer 512 is flat and light is not reflected in the reflection layer 512 in the Z direction, the pattern 552 and the pattern 553 are not displayed. For example, when light is uniformly reflected in the reflection layer 512 in all of the directions, the intensity of light which is reflected in the Z direction is weak, and thus it is difficult for the pattern 552 and the pattern 553 to be conspicuous.

Since the reflection layer 512 is formed on the substrate 511 on which the transistors, the drive circuits, and the like are formed, that is, on the substrate 511 which includes various types of unevenness, it is difficult to control the reflection performance of the reflection layer 512 (the surface unevenness of the reflection layer 512). Therefore, in the organic EL device 500, when the necessary pattern 551 is displayed in such a way that light is reflected in the reflection layer 512 in a specific direction (Z direction), there is a problem in that the pattern 552 and the pattern 553 are displayed.

SUMMARY

The invention can be realized in the following forms or application examples.

Application Example 1

According to this application example, there is provided a display device including: an element substrate that has a polygonal display area on which a plurality of light emitting elements are arranged; and a transparent substrate that faces the element substrate and includes a first surface which faces the element substrate, a second surface which is arranged on a side opposite to the first surface, and side surfaces which cross the first surface and the second surface, light, which is emitted from the light emitting elements, is ejected from the second surface as display light, and, when it is assumed that a length of a shortest edge from among edges which form a circumference of a shape of the display area is X1, a length of a longest diagonal line from among diagonal lines of the shape of the display area is X3, a thickness of the transparent substrate is L1, a refraction index of the transparent substrate is n1, a refractive index of a medium which comes into contact with the second surface is n2, and a minimum value of an angle, which is generated between a progress direction of light emitted from the light emitting elements and a normal vector direction of the second surface when the light emitted from the light emitting elements is totally reflected in the second surface, is α, Expression (1) described below is realized.

$$X1/(2 \tan \alpha) \leq L1 \leq X3/(\tan \alpha) \quad (1)$$

When the light, which is emitted from the light emitting elements, is reflected in the second surface of the transparent substrate and faces the direction of the element substrate, is incident to the display area and is reflected in the display area of the element substrate, there is a problem in that a display quality is deteriorated. When the thickness L1 of the transparent substrate satisfies the above-described Expression (1), the light, which is emitted from the light emitting elements, is reflected in the second surface of the transparent substrate and faces the direction of the element substrate, is incident to the periphery (non-display area) of the display area and is reflected in the non-display area of the element substrate, it is possible to suppress the display quality from being deteriorated.

Accordingly, in the display device according to the application example, it is possible to provide a high-quality display.

Application Example 2

According to this application example, there is provided a display device including: an element substrate that includes a circular or elliptical display area on which a plurality of light emitting elements are arranged; and a transparent substrate that faces the element substrate and includes a first surface which faces the element substrate, a second surface which is arranged on a side opposite to the first surface, and side surfaces which cross the first surface and the second surface, light, which is emitted from the light emitting elements, is ejected from the second surface as display light, and, when it is assumed that a length of a shortest line from among lines which connect a circumference of the display area while passing through a center of the display area is X1, a length of a longest line from among lines which connect the circumference of the display area while passing through the center of the display area is X3, a thickness of the transparent substrate is L1, a refraction index of the transparent substrate is n1, a refractive index of a medium which comes into contact with the second surface is n2, and a minimum value of an angle, which is generated between a progress direction of light emitted from the light emitting elements and a normal vector direction of the second surface when the light emitted from the light emitting elements is totally reflected in the second surface, is α, Expression (1) described below is realized.

$$X1/(2 \tan \alpha) \leq L1 \leq X3/(\tan \alpha) \quad (1)$$

When the light, which is emitted from the light emitting elements, is reflected in the second surface of the transparent substrate and faces the direction of the element substrate, is incident to the display area and is reflected in the display area of the element substrate, there is a problem in that a display quality is deteriorated. When the thickness L1 of the transparent substrate satisfies the above-described Expression (1), the light, which is emitted from the light emitting elements, is reflected in the second surface of the transparent substrate and faces the direction of the element substrate, is incident to the periphery (non-display area) of the display area and is reflected in the non-display area of the element substrate, it is possible to suppress the display quality from being deteriorated.

Accordingly, in the display device according to the application example, it is possible to provide a high-quality display.

Application Example 3

In the display device according to the application example, it is preferable that a film, which absorbs light, be arranged in at least a part of the side surfaces.

The film, which absorbs light, is arranged in at least a part of the side surfaces of the transparent substrate. That is, since the film, which absorbs light, is arranged on a path through which light (reflected light), which causes unnecessary display to be performed, progresses, it is possible to suppress unnecessary display from being performed.

Application Example 4

In the display device according to the application example, it is preferable that a film, which absorbs light, be arranged in at least a part of a periphery of the display area on a surface which faces the transparent substrate of the element substrate.

The film, which absorbs light, is arranged in at least a part of the periphery of the display area on the surface which faces the transparent substrate of the element substrate. That is, since the film, which absorbs light, is arranged on the path, through which light (reflected light), which causes unnecessary display to be performed, progresses, it is possible to suppress unnecessary display from being performed.

Application Example 5

In the display device according to the application example, it is preferable that a resin, which absorbs light, be arranged in at least a part of a periphery of the display area between the element substrate and the transparent substrate.

The resin, which absorbs light, is arranged in at least a part of the periphery of the display area between the element substrate and the transparent substrate. That is, since the resin, which absorbs light, is arranged on the path through which light (reflected light), which causes unnecessary display to be performed, progresses, it is possible to suppress unnecessary display from being performed.

Application Example 6

In the display device according to the application example, it is preferable that the refractive index of the transparent substrate be in a range of 1.2 to 1.6.

The transparent substrate which has the refractive index in the range of 1.2 to 1.6 can cause the light, which is emitted from the light emitting elements, to pass (eject) to the side of the medium as the display light and can protect the light emitting elements such that the light emitting elements which are formed on the element substrate are not damaged.

Application Example 7

In the display device according to the application example, it is preferable that the medium be air.

When the light, which is emitted from the light emitting elements, is caused to be ejected to the side of air as the display light, it is possible to view an image using the display light.

Application Example 8

In the display device according to the application example, it is preferable that the second surface be covered by a film which has a refractive index lower than the refractive index of the transparent substrate.

It is preferable that the thickness L1 of the transparent substrate be in a range of $X1/(2 \tan \alpha)$ to $X3/(\tan \alpha)$ based on the above-described Expression (1). When the second surface of the transparent substrate is covered by a film which has a refractive index lower than the refractive index of the transparent substrate, it is possible to increase the minimum value $\alpha$ of the angle, generated between the progress direction of the light which is emitted from the light emitting elements and is totally reflected and the normal vector direction of the second surface, and the tangent value ($\tan \alpha$) thereof. Accordingly, compared to a case in which the second surface of the transparent substrate is covered by the film which has the low refractive index, it is possible to reduce the range of the preferable thickness L1 of the transparent substrate ($X1/(2 \tan \alpha)$ to $X3/(\tan \alpha)$), thereby realizing a thin transparent substrate.

Application Example 9

In the display device according to the application example, it is preferable that, when it is assumed that a maximum value of an angle generated between an ejection direction of the display light and the normal vector direction is β, an angle generated between a progress direction of light, which is emitted from the light emitting elements as the display light when the angle based on the normal vector direction is β, and the normal vector direction is γ, and an interval between the display area and the side surfaces is L2, Expression (2) and Expression (3) described below be are realized.

$$L1 \tan \gamma \leq L2 \leq X3 \quad (2)$$

$$\gamma = \sin^{-1}((n2/n1)\sin \beta) \quad (3)$$

When the interval L2 between the display area and the side surfaces of the transparent substrate satisfies the above-described Expression (2) and Expression (3), the light, which is emitted from the light emitting elements as the display light, is not shielded by the side surfaces of the transparent substrate. Accordingly, since all of the light, which is emitted from the light emitting elements as the display light, is ejected from the second surface of the transparent substrate to the side of the medium, it is possible to view an entire image using the display light.

Application Example 10

In the display device according to the application example, it is preferable that X3 be equal to or less than 25.4 mm.

Based on the above-described Expression (1), it is preferable that the thickness L1 of the transparent substrate be in the range of $X1/(2 \tan \alpha)$ to $X3/(\tan \alpha)$. When X3 is equal to or less than 25.4 mm, it is possible to set the preferable upper limit value ($X3/(\tan \alpha)$) of the thickness L1 of the transparent substrate in a range which is actually supplied.

Application Example 11

According to this application example, there is provided an electronic apparatus that includes the display device according to the application examples.

In the display device according to the application example, unnecessary display (deterioration of a display quality) is suppressed, and thus it is possible to provide a high-quality display. Accordingly, the electronic apparatus which includes the display device according to the application example can provide a high-quality display. For example, it is possible to apply the display device according to the application example to electronic apparatus which includes a display unit such as a head mounted display, a head up display, the electronic view finder of a digital camera, a portable information terminal, or navigation.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings. The embodiments show one aspect of the invention and do not limit the invention. Further, the embodiments may be arbitrarily changed within the scope of the technical gist of the invention. In addition, in each of the drawings below, each layer and each portion have sizes which can be recognized on the drawings, and thus the scales of each layer and each portion are different from actual scales.

First Embodiment

Outline of Organic El Device

An organic EL device 100 according to a first embodiment is an example of a "display device" of the invention, and is a self-luminous micro display which is suitable for the display unit of a head mounted display which will be described later.

Figure 1:
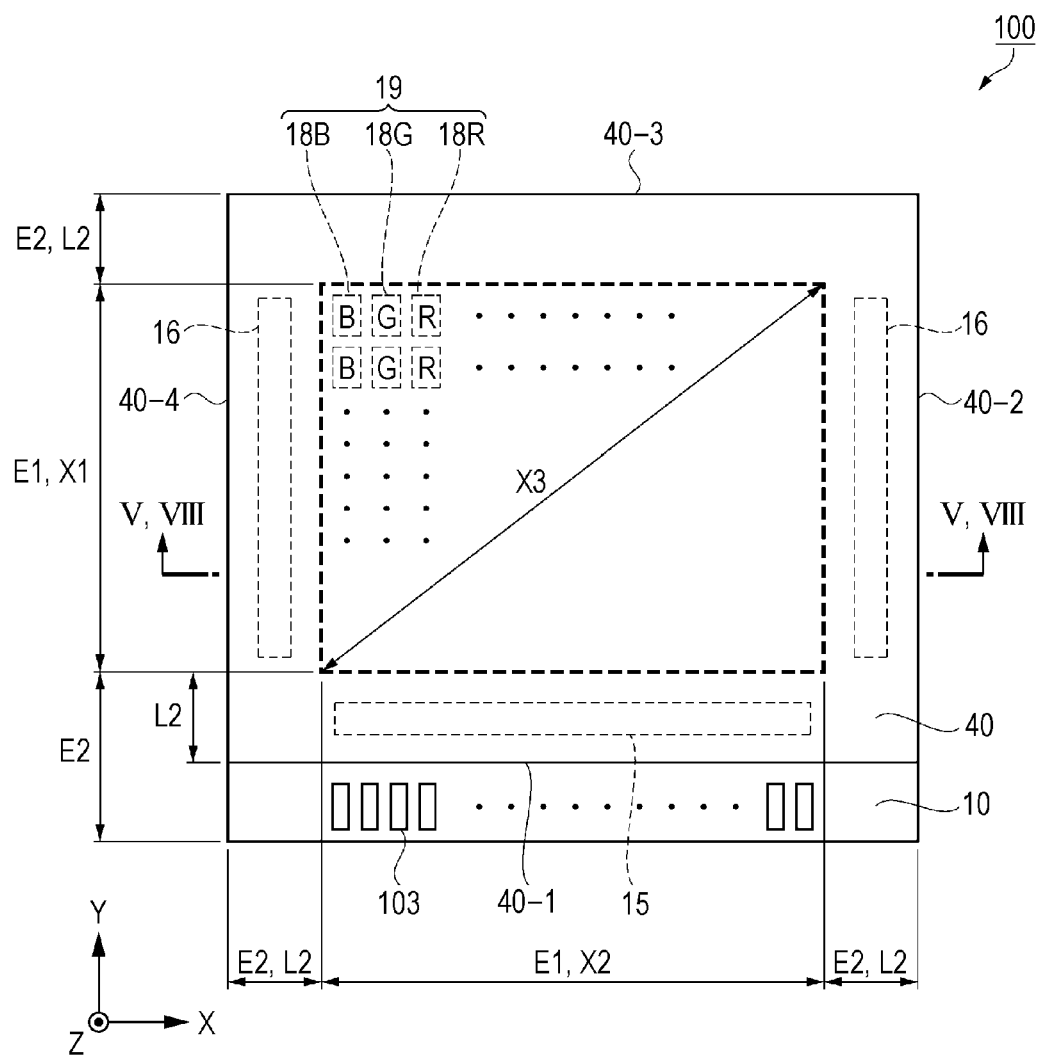
FIG. 1 is a schematic plan diagram illustrating the outline of an organic EL device according to a first embodiment.
Figure 2:
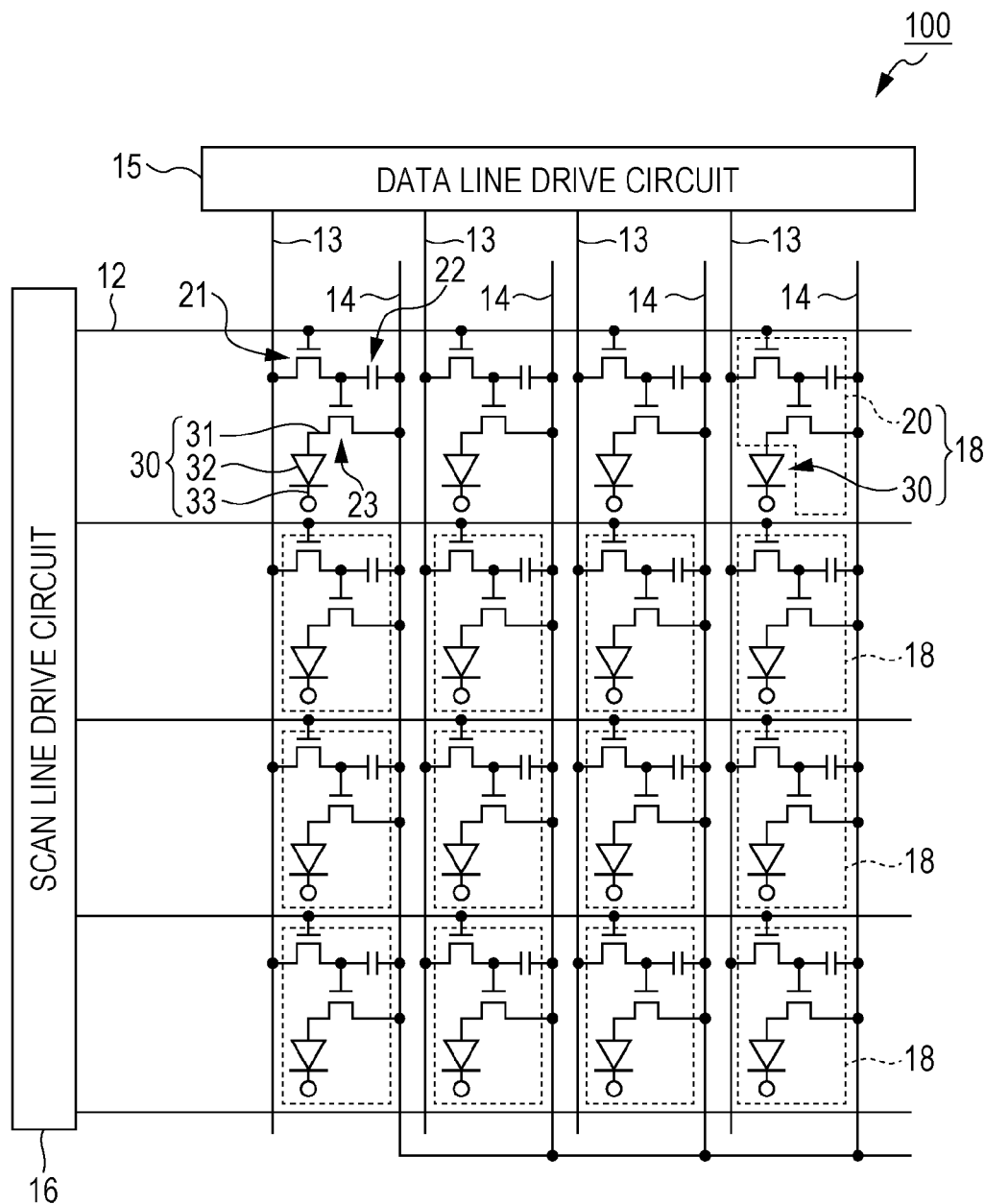
FIG. 2 is an equivalent circuit diagram illustrating the electrical configuration of the organic EL device according to the first embodiment.

FIG. 1 is a schematic plan diagram illustrating the outline of an organic EL device according to the embodiment. FIG. 2 is an equivalent circuit diagram illustrating the electrical configuration of the organic EL device according to the embodiment.

First, the outline of the organic EL device 100 according to the embodiment will be described with reference to FIGS. 1 and 2.

As shown in FIG. 1, the organic EL device 100 according to the embodiment includes an element substrate 10 and a counter substrate 40 which is arranged to be face the element substrate 10. Both the substrates are bonded by a resin layer 42 (refer to FIG. 4) which will be described later.

The element substrate 10 includes a display area E1 in which pixels 19 are arranged in a matrix shape, each of the pixels including a sub pixel 18B which emits blue color light, a sub pixel 18G which emits green color light, and a sub pixel 18R which emits red color light. The display area E1 is illustrated using thick broken lines in the drawing.

In the description below, there is a case in which the sub pixel 18B, the sub pixel 18G, and the sub pixel 18R are called a sub pixel 18. In addition, the display area E1 is an example of a "polygonal display area" of the invention.

A plurality of external connection terminals 103 are arranged along the first edge of the element substrate 10. A data line drive circuit 15 is provided between the plurality of external connection terminals 103 and the display area E1. Scan line drive circuits 16 are provided between the display area E1 and the other second and third edges which are perpendicular to the first edge and face each other.

Hereinafter, it is assumed that a direction along the first side is the X direction and a direction along the other two edges (the second edge and the third edge), which are perpendicular to the first edge and face each other, is the Y direction. It is assumed that a direction which faces the counter substrate 40 from the element substrate 10 is the Z direction.

Meanwhile, the Z direction is an example of a "normal vector direction" of the invention.

The counter substrate 40 is a transparent glass substrate, and is arranged to face the element substrate 10. The refractive index n1 of the counter substrate 40 is approximately 1.46. The counter substrate 40 covers the display area E1, and protects organic EL elements 30 (refer to FIG. 2), which are arranged in the display area E1 and will be described later, from being damaged.

A plurality of external connection terminals 103 are arranged at a portion of the element substrate 10 which protrudes from the counter substrate 40 when viewed from the Z direction.

The counter substrate 40 includes a side surface 40-1 and a side surface 40-3 which extend along the X direction, and a side surface 40-2 and a side surface 40-4 which extend along the Y direction. The side surfaces 40-1, 40-2, 40-3, and 40-4 are surfaces which are perpendicular to the surface 40a of the counter substrate 40 (refer to FIG. 4), which will be described later, and a surface of the counter substrate 40, which faces the element substrate 10.

Meanwhile, the counter substrate 40 may be a transparent insulation substrate, and it is possible to use, for example, a quartz substrate, a resin which has transparency, and the like as the counter substrate 40 in addition to the above-described glass substrate. It is preferable that the refractive index n1 of the counter substrate 40 be included in a range of 1.2 to 1.6.

In addition, the refractive index has wavelength dependency. Here, a refractive index in a visible light wavelength region is used. For example, a refractive index on a short wavelength side, which has the refractive index greater than that of a long wavelength side, may be used in the visible light wavelength region, and a reflective index which uses 550 nm, in which a visible sensitivity is higher than the other wavelength, as a representative wavelength may be used.

The shape of the display area E1 of the embodiment is a rectangle which is long in the X direction. The length of an edge, which forms the circumference of the shape of the display area E1 in the X direction, is X2. The length of an edge, which forms the circumference of the shape of the display area E1 in the Y direction, is X1. The length of the diagonal line of the shape of the display area E1 (rectangle) is X3. The length X3 of the diagonal line of the shape of the display area E1 is approximately 25.4 mm.

From among lengths of lines which connect two points of the circumference of the display area E1. X1 is the shortest and X3 is the largest. Hereinafter, the length of the diagonal line of the shape of the display area E1 is called a display size.

The edge which forms the circumference of the shape of the display area E1 in the Y direction is an example of "the shortest edge from among the edges which form the circumference of the shape of the polygonal display area" in the invention. The diagonal line of the shape (rectangle) of the display area E1 is an example of "the largest diagonal line from among the diagonal lines of the shape of the polygonal display area" in the invention.

The peripheral area of the display area E1, that is, an area between the display area E1 and the outer edge of the element substrate 10 is a non-display area E2. In addition, the gap between the display area E1 and the side surfaces 40-1, 40-2, 40-3, and 40-4 (the outer edge of the counter substrate 40) is L2.

As shown in FIG. 2, the organic EL device 100 includes a plurality of scan lines 12 and a plurality of data lines 13, which cross each other, and a plurality of power lines 14 which are parallel to the plurality of data lines 13 respectively. The scan lines 12 are connected to the scan line drive circuit 16, and the data lines 13 are connected to the data line drive circuit 15. In addition, the organic EL device 100 includes a plurality of sub pixels 18 which correspond to respective intersections between the plurality of scan lines 12 and the plurality of data lines 13 and are arranged in a matrix shape.

The sub pixel 18 includes an organic EL element 30 and a pixel circuit 20 which controls the drive of the organic EL element 30.

The organic EL element 30 includes a pixel electrode 31, a light emitting function layer 32, and a counter electrode 33. The pixel electrode 31 functions as an anode which supplies holes to the light emitting function layer 32. The counter electrode 33 functions as a cathode which supplies electrons to the light emitting function layer 32. The holes which are supplied from the pixel electrode 31 are combined with the electrons which are supplied from the counter electrode 33 in the light emitting function layer 32, and thus the light emitting function layer 32 emits white color light.

Meanwhile, the organic EL element 30 is an example of a "light emitting element" of the invention.

The pixel circuit 20 includes a switching transistor 21, a storage capacity 22, and a drive transistor 23. It is possible to form the two transistors 21 and 23 using, for example, n-channel type or p-channel type transistors.

The gate of the switching transistor 21 is connected to the scan line 12. One of the source and the drain of the switching transistor 21 is connected to the data line 13. The remaining one of the source and the drain of the switching transistor 21 is connected to the gate of the drive transistor 23.

One of the source and the drain of the drive transistor 23 is connected to the pixel electrode 31 of the organic EL element 30. The remaining one of the source and the drain of the drive transistor 23 is connected to the power line 14. A storage capacity 22 is connected between the gate of the drive transistor 23 and the power line 14.

When the scan line 12 is driven and the switching transistor 21 is turned on, potential is held in the storage capacity 22 through the switching transistor 21 based on a pixel signal which is supplied from the data line 13 at that time. The on or off state of the drive transistor 23 is determined according to the potential of the storage capacity 22, that is, the gate potential of the drive transistor 23. Further, when the drive transistor 23 is in an on state, an amount of current according to the gate potential flows to the light emitting function layer 32 which is interposed between the pixel electrode 31 and the counter electrode 33 from the power line 14 through the drive transistor 23. The brightness of light which is emitted from the organic EL element 30 changes according to the density of current which flows to the light emitting function layer 32.

Outline of Sub Pixel

Figure 3:
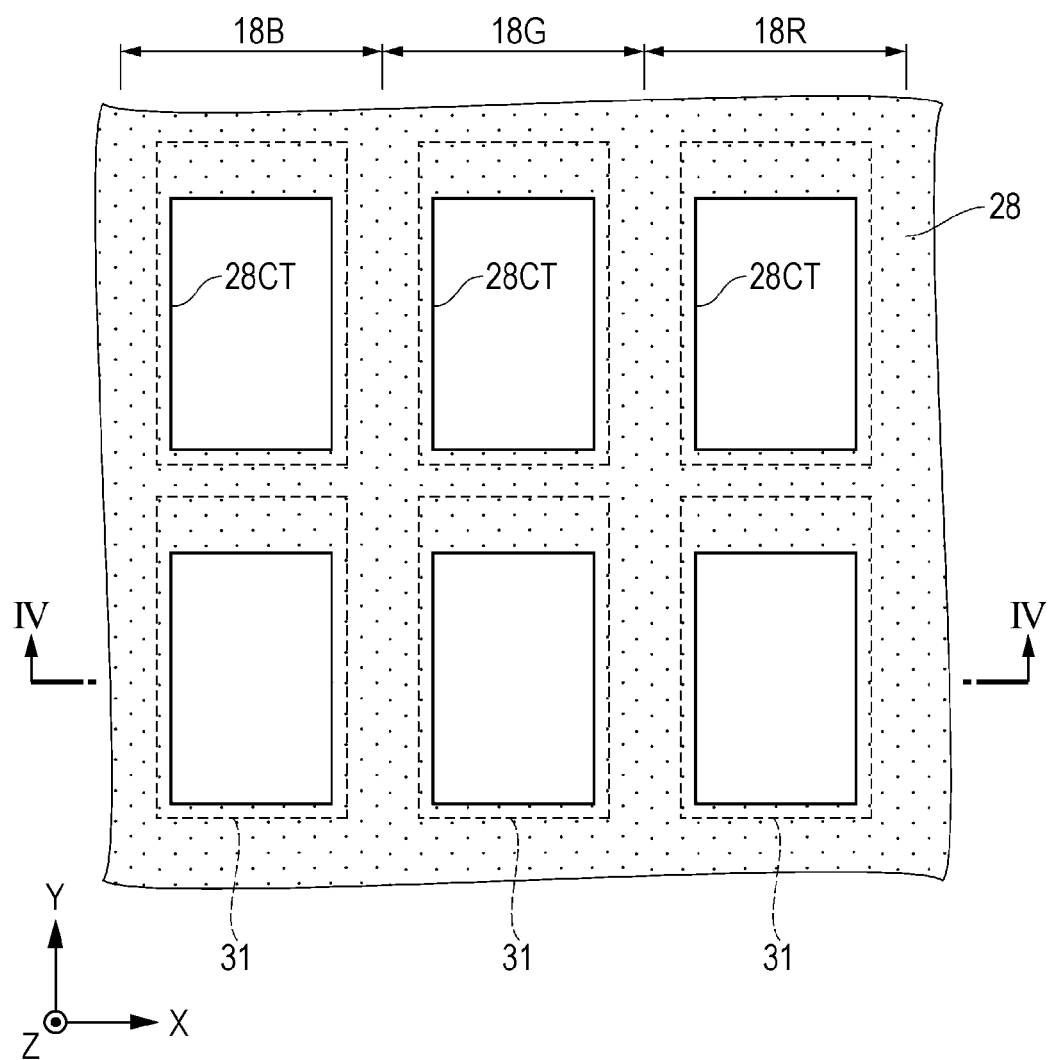
FIG. 3 is a schematic plan diagram illustrating the configuration of sub pixels.

FIG. 3 is a schematic plan diagram illustrating the configuration of the sub pixel. In FIG. 3, the pixel electrode 31 and the insulation film 28 are shown from among the components of the sub pixel 18, and the other components are not shown in the drawing.

Subsequently, the outline of the sub pixel 18 will be described with reference to FIG. 3.

As shown in FIG. 3, the pixel electrode 31 and the insulation film 28 are arranged in the sub pixel 18. The pixel electrode 31 has light transparency, is formed of, for example, a transparent material, such as Indium Tin Oxide (ITO), and is formed in an island shape for each sub pixel 18.

Figure 4:
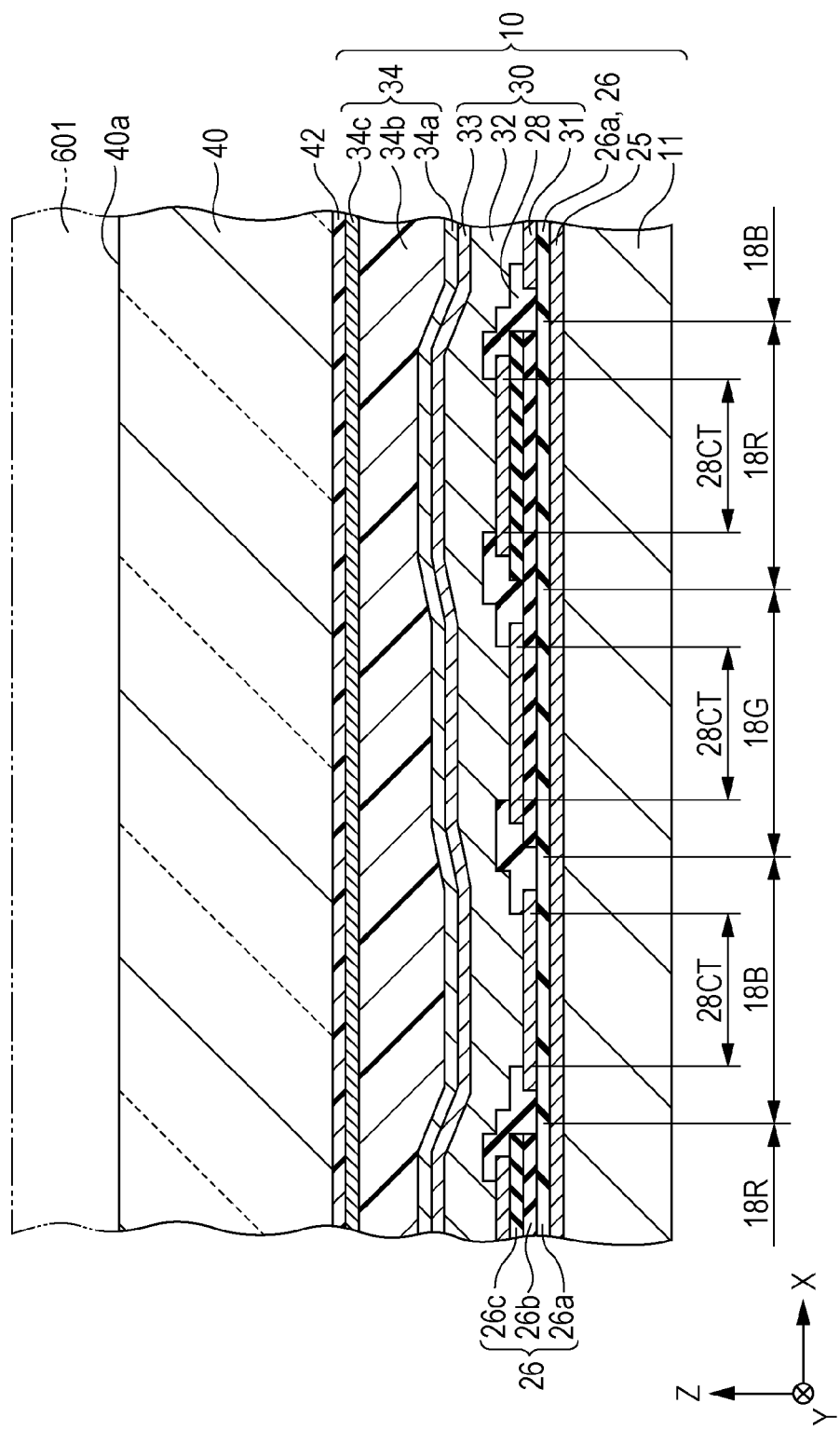
FIG. 4 is a schematic cross-sectional diagram illustrating the configuration of the organic EL device taken along line IV-IV of FIG. 3.

The insulation film 28 is provided between the pixel electrode 31 and the light emitting function layer 32 (refer to FIG. 4). The insulation film 28 is arranged to cover the periphery of the pixel electrode 31, and includes an opening 28CT which exposes the pixel electrode 31.

In a portion where the opening 28CT is provided, the pixel electrode 31 is connected to the light emitting function layer 32, holes are supplied to the light emitting function layer 32 from the pixel electrode 31, and the light emitting function layer 32 emits light. That is, an area in which the opening 28CT is provided is a light emitting area in which the light emitting function layer 32 emits light. In an area in which the insulation film 28 is provided, the supply of holes from the pixel electrode 31 to the light emitting function layer 32 is suppressed and the light emission of the light emitting function layer 32 is suppressed. That is, the area in which the insulation film 28 is provided is an area in which the light emission of the light emitting function layer 32 is suppressed.

Cross-Sectional Structure of Organic EL Device

FIG. 4 is a schematic cross-sectional diagram illustrating the configuration of the organic EL device taken along line IV-IV of FIG. 3.

Subsequently, the cross-sectional structure of the organic EL device 100 will be described with reference to FIG. 4.

As shown in FIG. 4, in the organic EL device 100, the element substrate 10, the resin layer 42, and the counter substrate 40 are sequentially laminated in the Z direction. Further, the counter substrate 40 comes into contact with the air 601. The refractive index n2 of the air 601 is approximately 1.

Meanwhile, the air 601 is an example of a "medium" in the invention.

The surface 40a on a side opposite to the surface of the counter substrate 40, which faces the element substrate 10, is a surface on a side in which light emitted from the organic EL element 30 is ejected as display light. That is, the display light is ejected from the surface 40a on the side opposite to the surface of the counter substrate 40, which faces the element substrate 10, to the side of the air 601.

The resin layer 42 has a function to bond the element substrate 10 to the counter substrate 40, and it is possible to use, for example, an epoxy resin, an acrylic resin, or the like as the resin layer 42.

The element substrate 10 includes a substrate 11, a reflection layer 25 which is sequentially laminated on the substrate 11 in the Z direction, an optical distance adjustment layer 26, an organic EL element 30, and a sealing layer 34.

The substrate 11 is a semiconductor substrate in which, for example, the scan lines 12, the data lines 13, the power lines 14, the data line drive circuit 15, the scan line drive circuits 16, the switching transistors 21, the storage capacities 22, the drive transistors 23 (refer to FIG. 2) and the like are formed on a base material which is formed of silicon according to a well-known technology.

Meanwhile, the base material of the substrate 11 is not limited to the above-described silicon and may be, for example, a transparent insulation material such as quartz and glass.

The reflection layer 25 is one of a pair of reflection layers which reflect light emitted from the light emitting function layer 32. The reflection layer 25 is formed of a material which has high reflectance and is arranged across the plurality of sub pixels 18. It is possible to use, for example, aluminum, silver, or the like as the component material of the reflection layer 25.

The optical distance adjustment layer 26 includes a first insulation film 26a, a second insulation film 26b, and a third insulation film 26c. The first insulation film 26a is provided on the reflection layer 25 and is arranged on the sub pixel 18B, the sub pixel 18G, and the sub pixel 18R. The second insulation film 26b is provided on the first insulation film 26a, and is arranged on the sub pixel 18G and the sub pixel 18R. The third insulation film 26c is provided on the second insulation film 26b and is arranged on the sub pixel 18R. As a result, the thickness of the optical distance adjustment layer 26 is large in order of the sub pixel 18B, the sub pixel 18G, and the sub pixel 18R.

The organic EL element 30 includes the pixel electrode 31, the insulation film 28, the light emitting function layer 32, and the counter electrode 33 which are sequentially laminated in the Z direction.

The light emitting function layer 32 includes a hole injection layer, a hole transport layer, an organic light emitting layer, an electron transport layer, and the like which are sequentially laminated in the Z direction. The organic light emitting layer emits light which has red, green, and blue color light components. The organic light emitting layer may include a single layer or may include a plurality of layers (for example, a blue color light emission layer which emits blue color light and a yellow color light emission layer which emits light including a red color and a green color).

The counter electrode 33 is formed of, for example, an alloy Mg and Ag, and has light transparency and light reflectivity. The counter electrode 33 is a remaining reflection layer of the pair of reflection layers which reflect light emitted from the light emitting function layer 32.

The sealing layer 34 includes a first sealing layer 34a, a planarization layer 34b, and a second sealing layer 34c which are sequentially laminated in the Z direction, covers the organic EL element 30, and is provided on approximately the whole surface of the element substrate 10. Meanwhile, openings (not shown in the drawing), which expose the external connection terminals 103 (refer to FIG. 1), are provided in the sealing layer 34.

The first sealing layer 34a and the second sealing layer 34c is formed of a silicon nitride which is formed using, for example, a plasma Chemical Vapor Deposition (CVD) method or the like according to the well-known technology, and has a high barrier property for moisture and oxygen.

The planarization layer 34b is formed of, for example, an epoxy-based resin, a coating-type inorganic material (for example, silicon oxide), or the like. The planarization layer 34b forms a planarized surface by coating the defects (pinholes or cracks) or foreign substances of the first sealing layer 34a.

Optical Resonance Structure

In a light emission area (area provided with the opening 28CT), the reflection layer 25 which has the light reflectivity, the optical distance adjustment layer 26, the pixel electrode 31, the light emitting function layer 32, and the counter electrode 33 are sequentially laminated in the Z direction. Light emitted from the light emitting function layer 32 is repeatedly reflected between the reflection layer 25 and the counter electrode 33, the intensity of light having a specific wavelength (resonance wavelength) corresponding to the optical distance between the reflection layer 25 and the counter electrode 33 is amplified, and then light is ejected to the side of the air 601 from the surface 40a of the counter substrate 40 as display light.

More specifically, the optical distance adjustment layer 26 has a function to adjust the optical distance between the reflection layer 25 and the counter electrode 33. In the sub pixel 18B, the film thickness of the optical distance adjustment layer 26 is set such that a resonance wavelength (peak wavelength at which brightness is the maximum) is 470 nm. In the sub pixel 18G, the film thickness of the optical distance adjustment layer 26 is set such that the resonance wavelength is 540 nm. In the sub pixel 18R, the film thickness of the optical distance adjustment layer 26 is set such that the resonance wavelength is 610 nm.

As a result, blue color light which has a peak wavelength of 470 nm is emitted from the sub pixel 18B, green color light which has a peak wavelength of 540 nm is emitted from the sub pixel 18G, and red color light which has a peak wavelength of 610 nm is emitted from the sub pixel 18R.

Feature of Organic EL Device

As described above, the organic EL device 100 includes a configuration in which color filters are removed from the organic EL device according to the well-known technology (JP-A-2012-38677). Therefore, in the organic EL device 100, unnecessary display is performed due to light reflected in the reflection layer 25, and thus there is a problem in that display quality is deteriorated. As described above, in order to suppress unnecessary display due to light reflected in the reflection layer 25, the reflection performance of the reflection layer 25 may be controlled. However, since the foundation (substrate 11), on which the reflection layer 25 is formed, includes various types of unevenness because the pixel circuits 20, the drive circuits 15 and 16, and the like are formed, it is difficult to control the reflection performance of the reflection layer 25 (the surface unevenness of the reflection layer 25).

It is possible for the organic EL device 100 according to the embodiment to suppress unnecessary display (deterioration in display quality) due to light reflected in the reflection layer 25 regardless of the reflection performance of the reflection layer 25. Hereinafter, the suppression will be described in detail.

Figure 5:
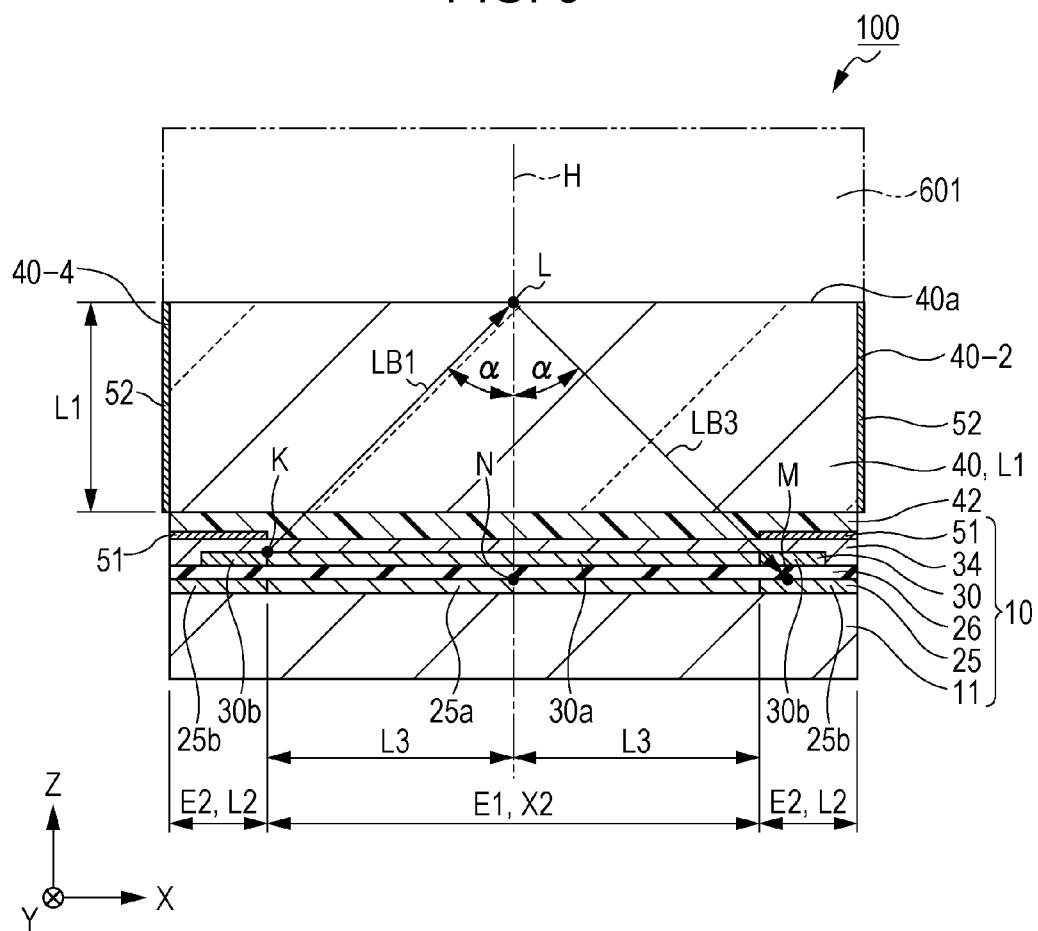
FIG. 5 is a schematic cross-sectional diagram illustrating the organic EL device taken along line V-V of FIG. 1.
Figure 11:
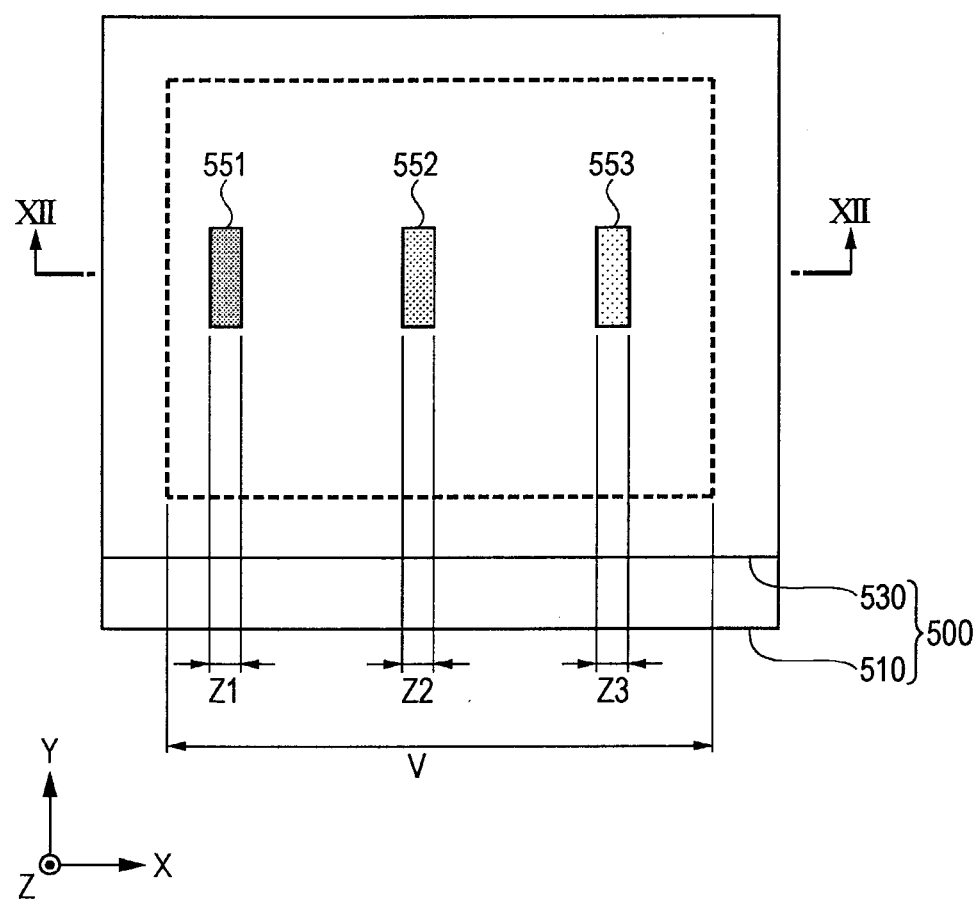
FIG. 11 is a schematic diagram illustrating an organic EL device according to a well-known technology.
Figure 12A:
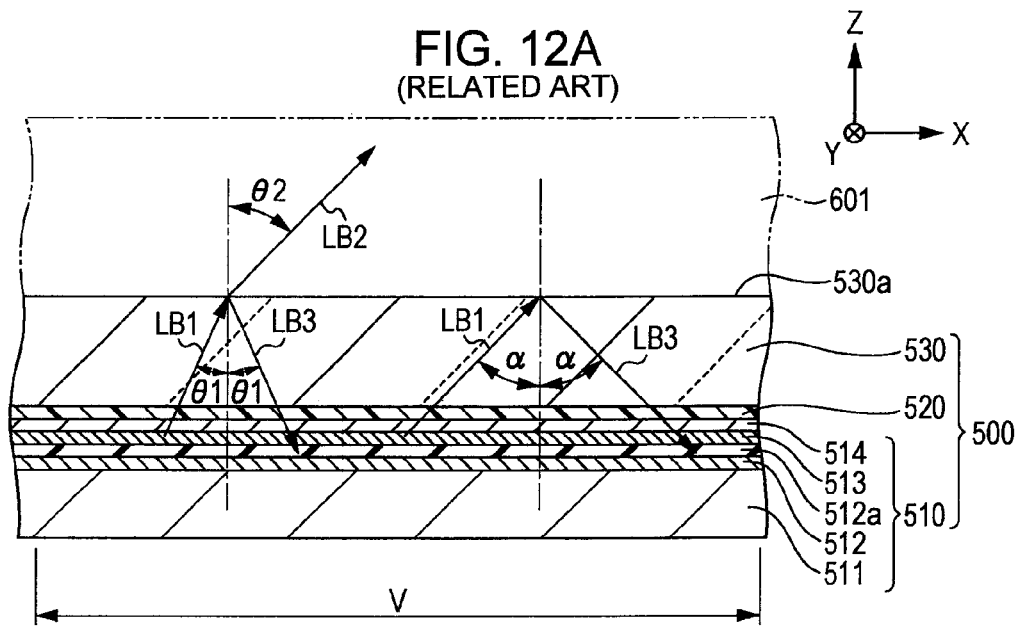
FIGS. 12A and 12B are typical cross-sectional diagrams taken along line XII-XII of FIG. 11.
Figure 12B:
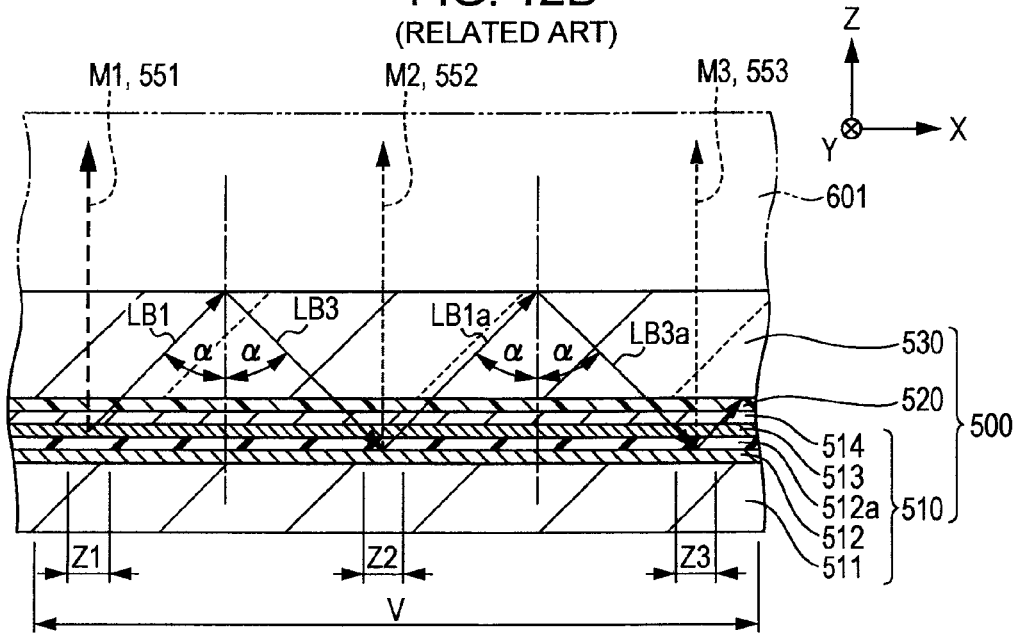

FIG. 5 is a schematic cross-sectional diagram illustrating the organic EL device taken along line V-V of FIG. 1. In FIG. 5, the same reference symbols indicate the same components as in the above-described FIG. 11, that is, reference symbol LB1 is attached to incident light which is emitted from the organic EL element 30 and faces the surface 40a, reference symbol LB3 is attached to light which is reflected in the surface 40a, and reference symbol α is attached to a critical angle at which the incident light LB1 is totally reflected in the surface 40a.

In addition, a dot K in the drawing corresponds to the end portion of the side of the X (−) direction of the organic EL element 30 arranged in the display area E1. A dot L indicates a point of the intersection between the incident light LB1, which is emitted from the dot K, and the surface 40a. A dot M indicates a point of the intersection between the reflected light LB3, which is reflected in the dot L of the surface 40a, and the reflection layer 25. A dot N indicates a point of the intersection between the normal vector H of the surface 40a, which passes through the dot L, and the reflection layer 25.

As shown in FIG. 5, the incident light LB1, which is emitted from the dot K of the organic EL element 30 becomes the reflected light LB3 which is reflected in the dot L of the surface 40a. The reflected light LB3 which is reflected in the dot L of the surface 40a reaches the dot M of the reflection layer 25. An angle generated between the progress direction of the incident light LB1 and the normal vector H (Z direction) is the critical angle α, and the angle generated between the progress direction of the reflected light LB3 and the normal vector H (Z direction) is also the critical angle α.

The critical angle α is the minimum value of an angle generated between the progress direction of the incident light LB1 and the normal vector H (Z direction) when the incident light LB1 is totally reflected in the surface 40a. That is, when the angle generated between the progress direction of the incident light LB1 and the normal vector H (Z direction) includes the critical angle α and is greater than the critical angle α, the incident light LB1 is totally reflected in the surface 40a. When the angle generated between the progress direction of the incident light LB1 and the normal vector H (Z direction) is smaller than the critical angle α, some of the incident light LB1 pass through the surface 40a and are ejected to the side of the air 601, and some of the incident light LB1 are reflected in the surface 40a.

Meanwhile, the critical angle α is "the minimum value of an angle generated between the progress direction of light, which is emitted from the light emitting elements when the light is emitted from the light emitting elements and is totally reflected in the second surface, and the normal vector direction of the second surface" in the invention.

The optical distance adjustment layer 26, the organic EL element 30, the sealing layer 34, the resin layer 42, and the counter substrate 40 are sequentially laminated on the reflection layer 25 of the display area E1. The optical distance adjustment layer 26, the organic EL element 30, the sealing layer 34, a light shielding layer 51, the resin layer 42, and the counter substrate 40 are sequentially laminated on the reflection layer 25 of the non-display area E2.

The light shielding layer 51 has a light absorption property, and is formed on the sealing layer 34 using, for example, a photoresist in which black pigments are dispersed. The light shielding layer 51 is one of the components which form the element substrate 10. The light shielding layer 51 may have the light absorption property, and can be formed of, for example, titanium nitride, a dielectric multilayer, or the like in addition to the above-described photoresist. The light shielding layer 51 has a function to shield the reflected light in the reflection layer 25 of the non-display area E2, may be arranged across the whole surface of the non-display area E2, and may be arranged in a part of the non-display area E2. That is, the light shielding layer 51 is arranged in at least a part of the non-display area E2.

In other words, a film (light shielding layer 51) which absorbs light is arranged in at least a part of the non-display area E2 on a surface of the element substrate 10 (the surface of the sealing layer 34) which faces the counter substrate 40.

The light shielding layer 52 is arranged on the side surfaces 40-2 and 40-4 of the counter substrate 40. Although not shown in the drawing, the light shielding layer 52 is arranged on the side surfaces 40-1 and 40-3 of the counter substrate 40. The light shielding layer 52 may include the light absorption property as the same as the light shielding layer 51, and may be formed by coating a resin which has the light absorption property or a resin in which materials (for example, black pigments) which have the light absorption property are dispersed. In addition, the light shielding layer 52 may be formed by pasting a tape which has the light absorption property.

The light shielding layer 52 may be arranged on the whole surfaces of the side surfaces 40-1, 40-2, 40-3, and 40-4 or may be arranged in a part of the side surfaces 40-1, 40-2, 40-3, and 40-4. That is, the light shielding layer 52 may be arranged in at least a part of the side surfaces 40-1, 40-2, 40-3, and 40-4. Further, the light shielding layer 52 may be arranged in at least a part of the side surfaces of the element substrate 10.

Although description will be made in detail later, the size (board thickness) L1 of the counter substrate 40 in the Z direction is in a range of 13.5 mm to 27 mm. The sizes (film thickness) of the optical distance adjustment layer 26, the organic EL element 30, and the sealing layer 34 in the Z direction (layer thickness) are less than 1 μm, the size (layer thickness) of the resin layer 42 in the Z direction is less than approximately 20 μm. The sizes of all of the components in the Z direction are extremely small compared to the size (board thickness) L1 of the counter substrate 40 in the Z direction. Therefore, it is possible to regard the size between the reflection layer 25 and the surface 40a in the Z direction as the size (board thickness) L1 of the counter substrate 40 in the Z direction. Accordingly, it is possible to regard that the dot K of the organic EL element 30, the dot N of the reflection layer 25, and the dot M of the reflection layer 25 are arranged on the same plan surface.

The reflection layer 25 includes a first reflection layer 25a which is arranged in the display area E1, and a second reflection layer 25b which is arranged in the non-display area E2. The organic EL element 30 includes a first organic EL element 30a which is arranged in the display area E1 and a second organic EL element 30b which is arranged in the non-display area E2.

Meanwhile, the second organic EL element 30b which is arranged in the non-display area E2 corresponds to the organic EL element 30 in a state in which light emission from the light emitting function layer 32 is suppressed, for example, the organic EL element 30 which includes a configuration in which the pixel electrode 31 is omitted, the organic EL element 30 which includes a configuration in which the whole pixel electrode 31 is covered by the insulation film 28, and the like.

In the embodiment, the incident light LB1 emitted from the end portion (dot K) of the first organic EL element 30a, which is arranged in the display area E1, on the side of the X (−) direction is reflected in the dot L of the surface 40a and becomes the reflected light LB3. The reflected light LB3 is incident to the dot M of the second reflection layer 25b, which is arranged in the non-display area E2, on the side of the X (+) direction.

Although not shown in the drawing, the incident light LB1 emitted from the end portion of the first organic EL element 30a, which is arranged in the display area E1, on the side of the X (+) direction is reflected in the surface 40a and becomes the reflected light LB3, and the reflected light LB3 is incident to the second reflection layer 25b, which is arranged in the non-display area E2, on the side of the X (−) direction.

That is, in the organic EL device 100, the reflected light LB3 of the light (incident light LB1) which is emitted from the first organic EL element 30a is incident to the second reflection layer 25b which is arranged in the non-display area E2. Since the reflected light LB3 is reflected in the second reflection layer 25b which is arranged in the non-display area E2, it is difficult for the reflected light LB3 to progress to the side of the display area E1 and thus it is difficult to perform unnecessary display.

Further, since the light shielding layer 51 is arranged on the second reflection layer 25b of the non-display area E2, the light which is reflected in the second reflection layer 25b is shielded by the light shielding layer 51, and thus it is further difficult for the light to progress to the side of the display area E1. That is, compared to a configuration in which the light shielding layer 51 is not arranged, it is further difficult for the light which is reflected in the second reflection layer 25b to progress to the side of the display area E1, and thus it is further difficult to perform unnecessary display.

In other words, in the embodiment, the size between the reflection layer 25 and the surface 40a in the Z direction, that is, the size (board thickness) L1 of the counter substrate 40 in the Z direction is set such that the reflected light LB3 which is reflected in the surface 40a is incident to the second reflection layer 25b which is arranged in the non-display area E2. As described above, since it is difficult for the light which is reflected in the second reflection layer 25b to progress to the side of the display area E1, it is possible to suppress unnecessary display from being performed in the display area E1.

Further, the side surfaces 40-1, 40-2, 40-3, and 40-4 of the counter substrate 40 are covered by the light shielding layer 52, and thus light is suppressed from being reflected in the side surfaces 40-1, 40-2, 40-3, and 40-4. Accordingly, it is difficult for the light reflected in the side surfaces 40-1, 40-2, 40-3, and 40-4 to affect the display area E1. Accordingly, it is possible to suppress unnecessary display from being performed in the display area E1.

Proper Thickness of Counter Substrate

Subsequently, the board thickness L1 of the counter substrate 40, in which the incident light LB1, the angle based on the Z direction of which is the critical angle α, can be reflected in the surface 40a and can be incident to the second reflection layer 25b, will be described.

The reflected light LB3 of the incident light LB1, the angle based on the Z direction of which is greater than the critical angle α, progresses to a side (the side of the X direction) which is separated from the normal vector H shown in FIG. 5, compared to the reflected light LB3 of the incident light LB1, the angle based on the Z direction of which is the critical angle α. Accordingly, under a condition that the reflected light LB3 of the incident light LB1, the angle based on the Z direction of which is the critical angle α, is incident to the second reflection layer 25b, the reflected light LB3 of the incident light LB1, the angle based on the Z direction of which is greater than the critical angle α, is not incident to the display area E1. Accordingly, in order to cause the reflected light LB3 to usually be incident to the second reflection layer 25b, a condition that the reflected light LB3 of the incident light LB1, the angle based on the Z direction of which is the critical angle α, is incident to the second reflection layer 25b may be satisfied.

When the angle generated between the progress direction of the incident light LB1 and the normal vector H (Z direction) is set to θ1 and the angle generated between the ejection direction, acquired when the incident light LB1 passes through the surface 40a and is ejected to the side of the air 601, and the normal vector H (Z direction) is set to θ2, Expression (1) described below is realized based on Snell's law.

$$n1 \sin θ1 = n2 \sin θ2 \quad (1)$$

Based on Expression (1), the angle θ1 generated between the progress direction of the incident light LB1 and the Z direction is expressed by Expression (2) described below.

$$θ1 = \sin^{-1}((n2 \sin θ2)/n1) \quad (2)$$

Since θ1, acquired by substituting "θ2=90°" in Expression (2), is the critical angle α, the critical angle α is expressed by Expression (3) described below.

$$α = \sin^{-1}(n2/n1) \quad (3)$$

In the embodiment, since n1 is approximately 1.46 and n2 is approximately 1, the critical angle α is approximately 43°.

In a triangle (ΔKLM) which is formed by the dot K, the dot L, and the dot N and a triangle (ΔLMN) which is formed by the dot L, the dot M, and the dot N, an angle between line LK and line LN is the same as an angle between line LM and line LN and an angle between line LN and line NK is the same as an angle between line LN and line NM. Therefore, the ΔKLN and the ΔLMN are congruent. Accordingly, the length of a line (edge KN) which connects the dot K and the dot N is the same as the length of a line (edge NM) which connects the dot N and the dot M, and both the lengths are L3.

When the length of a line (edge KM) which connects the dot K and the dot M is longer than the length X2 of the edge of the display area E1 along the X direction, it is possible to cause the reflected light LB3 to be incident to the second reflection layer 25b. Since the length of the edge KM is two times longer than the length L3 of the edge KN, it is possible to cause the reflected light LB3 to be incident to the non-display area E2 (second reflection layer 25b) when Expression (4) described below is satisfied.

$$2 \times L3 \geq X2 \quad (4)$$

It is possible to regard the length of the edge LN as the size (board thickness) L1 of the counter substrate 40 in the Z direction. Since an angle between the edge LK and the edge LN is the critical angle α, Expression (5) described below is realized.

$$2 \times (L1 \times \tan α) \geq X2 \quad (5)$$

Accordingly, in the X direction, when the size (board thickness) L1 of the counter substrate 40 in the Z direction satisfies Expression (6) below, it is possible to cause the reflected light LB3 to be incident to the non-display area E2 (second reflection layer 25b).

$$L1 \geq X2/(2 \tan α) \quad (6)$$

In the same manner, in the Y direction, when the board thickness L1 of the counter substrate 40 satisfies Expression (7) below, it is possible to cause the reflected light LB3 to be incident to the non-display area E2 (second reflection layer 25b).

$$L1 \geq X1/(2 \tan α) \quad (7)$$

In the same manner, in a direction along the diagonal line of the shape (rectangle) of the display area E1, when Expression (8) below is satisfied, it is possible to cause the reflected light LB3 to be incident to the non-display area E2 (second reflection layer 25b).

$$L1 \geq X3/(2 \tan α) \quad (8)$$

Meanwhile, X1 is the length of the short line of the lines which connect two dots of the circumference of the display area E1, and X3 is the length of the longest line of the lines which connect two dots of the circumference of the display area E1. Therefore, the preferable minimum value of the board thickness L1 of the counter substrate 40 is large in order of the preferable minimum value (X1/(2 tan α)) of the board thickness L1 of the counter substrate 40 in the Y direction, the preferable minimum value (X2/(2 tan α)) of the board thickness L1 of the counter substrate 40 in the X direction, and the preferable minimum value (X3/(2 tan α)) of the board thickness L1 of the counter substrate 40 in the direction along the diagonal line.

That is, in order to cause the counter substrate 40 to be thin by even a little, it is preferable that the condition of Expression (7), that is, the board thickness L1 of the counter substrate 40 be equal to or greater than the preferable minimum value (X1/(2 tan α)) of the board thickness L1 of the counter substrate 40 which is in the Y direction is satisfied.

In addition, when the board thickness L1 of the counter substrate 40 is too large, the board thickness L1 is not preferable from the point of view of miniaturization and a light weight of the organic EL device 100. Therefore, it is preferable that the board thickness L1 of the counter substrate 40 be two times the preferable minimum value (X3/(2 tan α)) of the board thickness L1 of the counter substrate 40 in the direction along the diagonal line, that is, the direction of the longest line of the lines which connect two dots of the circumference of the display area E1. That is, it is preferable that the board thickness L1 of the counter substrate 40 satisfy Expression (9) described below.

$$L1 \geq X3/(\tan \alpha) \tag{9}$$

Accordingly, in order to cause the reflected light LB3 to be incident to the non-display area E2 (second reflection layer 25b) based on Expression (7) and Expression (9), it is preferable that the board thickness L1 of the counter substrate 40 satisfy Expression (10) described below.

$$X1/(2 \tan \alpha) L1 \geq X3/(\tan \alpha) \tag{10}$$

When Expression (10) is satisfied, it is possible to cause the counter substrate 40 to be thinnest.

Further, it is preferable that the board thickness L1 of the counter substrate 40 satisfy Expression (11) described below based on Expression (8) and Expression (9).

$$X3/(2 \tan \alpha) \leq L1 \leq X3/(\tan \alpha) \tag{11}$$

As described above, when Expression (10) is satisfied, it is possible to acquire an advantage in which it is possible to cause the counter substrate 40 to be the thinnest. However, when one pattern in displayed in the display area E1, there is a problem in that unnecessary display is performed in a position which is separated from the one pattern by X1. When Expression (11) is satisfied, it is possible to suppress the unnecessary display from being performed in the position which is separated from the one pattern by X1, that is, in all of the directions on the X-Y plan surface, and thus it is further preferable.

Proper Display Size

Figure 6:
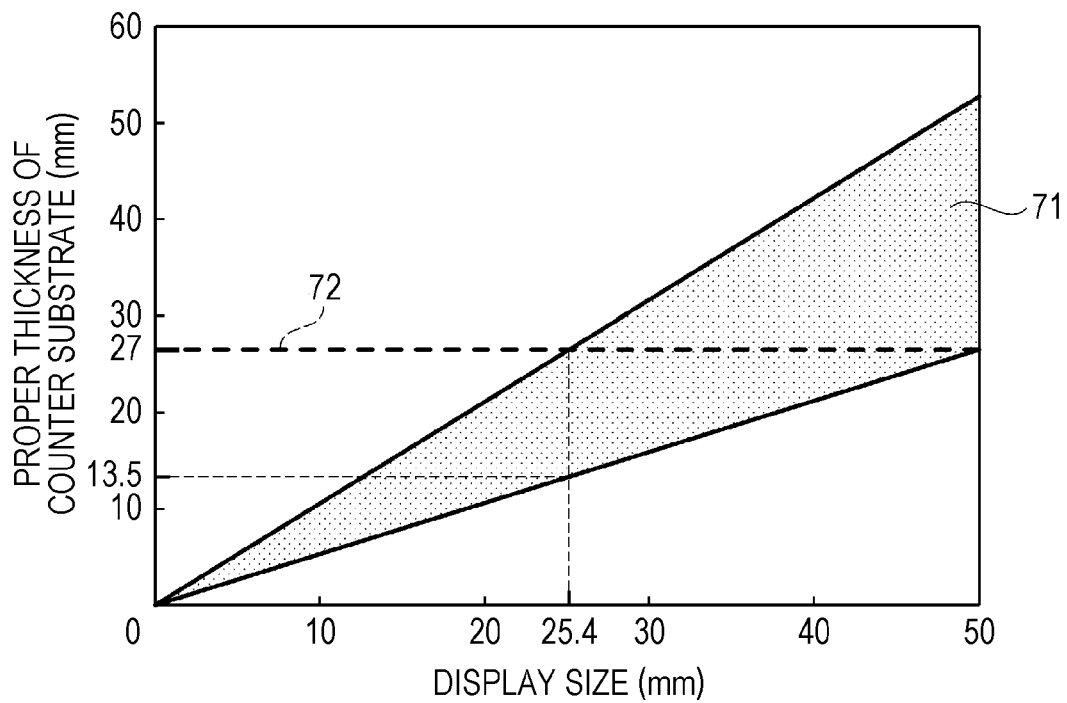
FIG. 6 is a graph illustrating the relationship between the proper thickness of a counter substrate and the diagonal size of a display area.

FIG. 6 is a graph illustrating the relationship between the proper thickness of the counter substrate and a display size (the length of the diagonal line of the shape of the display area E1). A vertical axis in the drawing indicates the board thickness L1 of the counter substrate, and a horizontal axis indicates the display size of the display area E1. In the drawing, the range of the proper board thickness L1 of the counter substrate 40 calculated in the above-described Expression (11) is shown in an area 71 which is shaded.

For example, when the organic EL device 100 is applied to the display unit of a small-sized electronic apparatus and when the board thickness of the counter substrate 40 is too large, the size of the appearance of the organic EL device 100 is too large, and thus it is not preferable. When the organic EL device 100 is applied to the display unit of the small-sized electronic apparatus, the upper limit value of the proper board thickness of the counter substrate 40 is a dotted line 72 in the drawing.

Accordingly, the point of intersection between the dotted line 72 and the upper limit of the area 71 is the upper limit value of the display size of the display area E1 when the organic EL device 100 is applied to the display unit of the small-sized electronic apparatus. Accordingly, the preferable display size of the display area E1 is equal to or less than 25.4 mm (1 inch).

Meanwhile, when the display size of the display area E1 is 25.4 mm, the preferable board thickness L1 of the counter substrate 40 is in a range of 13.5 mm to 27 mm. Accordingly, in the embodiment, setting is made such that the board thickness L1 of the counter substrate 40 is in the range of 13.5 mm to 27 mm.

Shape of Display Area

FIGS. 7A to 7J are diagrams illustrating an example of the shape of the display area of the organic EL device. That is, FIGS. 7A to 7J illustrate the shape of the display area E1 to which the above-described invention can be applied. Reference symbol X1 in the drawing indicates the length of the shortest edge from among the edges which form the circumference of the shape of the display area E1 or the length of the shortest line from among the lines which connect the circumference of the shape of the display area E1 while passing through the center CP of the display area E1. Reference symbol X3 indicates the length of the longest diagonal line from among the diagonal lines of the shape of the display area E1 or the longest line from among the lines which connect the circumference of the display area E1 while passing through the center CP of the display area E1.

Figure 7A:
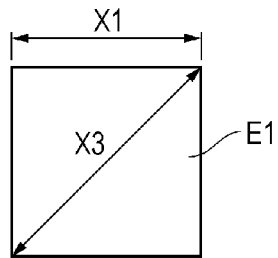
FIGS. 7A to 7J are diagrams illustrating suitable examples of the shape of the display area of the organic EL device.

As shown in FIG. 7A, the shape of the display area E1 is a square.

Figure 7F:
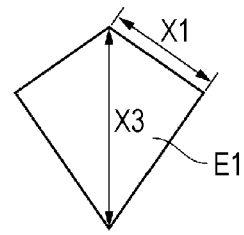
Figure 7B:
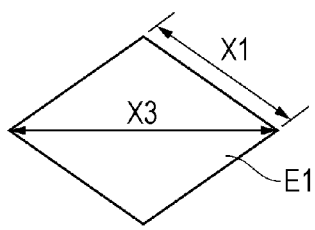

As shown in FIG. 7B, the shape of the display area E1 is a rhombus.

Figure 7G:
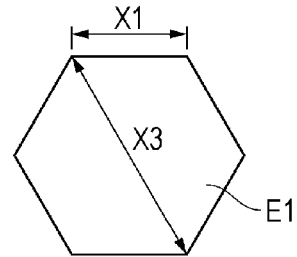
Figure 7C:
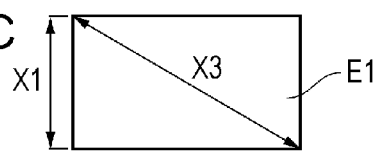

As shown in FIG. 7C, the shape of the display area E1 is a rectangle.

Figure 7H:
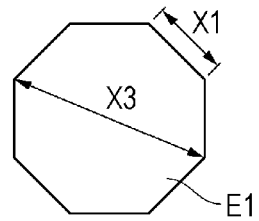
Figure 7D:
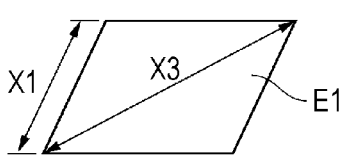

As shown in FIG. 7D, the shape of the display area E1 is a parallelogram.

Figure 7I:
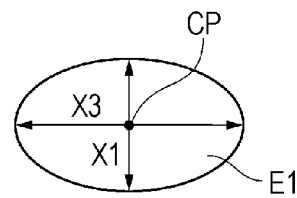
Figure 7E:
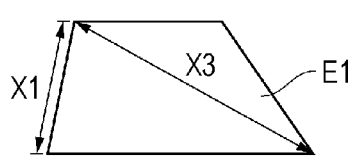

As shown in FIG. 7E, the shape of the display area E1 is a trapezoid.

As shown in FIG. 7F, the shape of the display area E1 is a kite shape.

As shown in FIG. 7G, the shape of the display area E1 is a hexagon.

As shown in FIG. 7H, the shape of the display area E1 is an octagon.

As shown in FIG. 7I, the shape of the display area E1 is an ellipse.

Figure 7J:
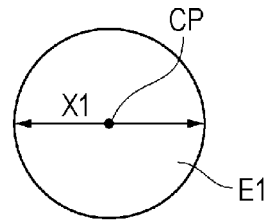

As shown in FIG. 7J, the shape of the display area E1 is a circle.

When the shape of the display area E1 is the square of FIG. 7A, the rhombus of FIG. 7B, the rectangle of FIG. 7C, the parallelogram of FIG. 7D, the trapezoid of FIG. 7E, the kite shape of FIG. 7F, the hexagon of FIG. 7G, the octagon of FIG. 7H, and the ellipse of FIG. 7I and when the board thickness L1 of the counter substrate 40 realizes the relationship in above-described Expression (8), it is possible to cause the reflected light LB3 to be incident to the second reflection layer 25b, and thus it is possible to suppress unnecessary display from being performed.

Further, when the shape of the display area E1 is the circle of FIG. 7J, the shortest line from among the lines which connect the circumference of the display area E1 while passing through the center CP of the display area E1 is the same as the longest line from among the lines which connect the circumference of the display area E1 while passing through the center CP of the display area E1, and both the lengths are X1. Accordingly, when the shape of the display area E1 is the circle and the relationship in Expression (12) described below is realized, it is possible to cause the reflected light LB3 to be incident to the non-display area E2 (second reflection layer 25b) and thus it is possible to suppress the unnecessary display from being performed.

$$X1/(2 \tan \alpha) \leq L1 \leq X1/(\tan \alpha) \tag{12}$$

Frame Width of Proper Counter Substrate 40

Figure 8:
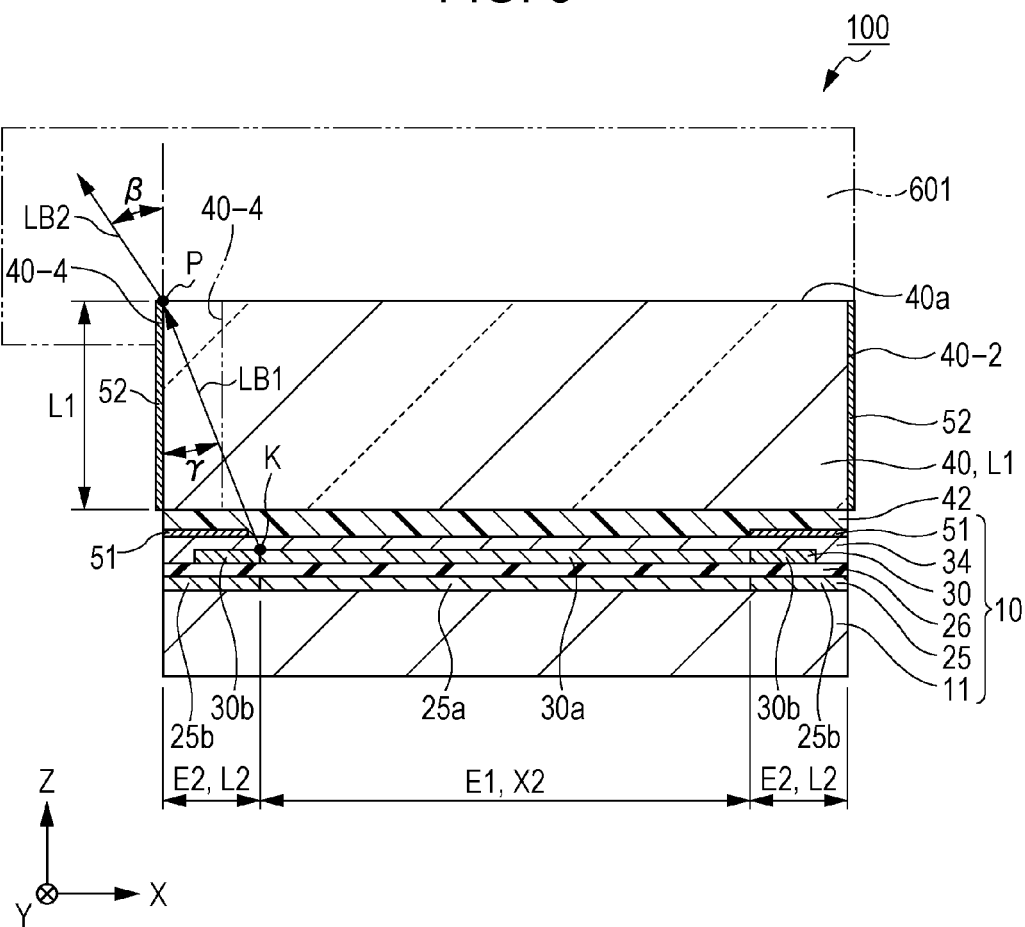
FIG. 8 is a schematic cross-sectional diagram illustrating the organic EL device taken along line VIII-VIII of FIG. 1.

FIG. 8 is a diagram corresponding to FIG. 5 and is a schematic cross-sectional diagram illustrating the organic EL device taken along line VIII-VIII of FIG. 1. In FIG. 8, the same reference symbols are attached to the same components as in FIG. 11, that is, the reference symbol LB1 is attached to incident light which is emitted from the organic EL element 30 and faces the surface 40a, and the reference symbol LB3 is attached to refracted light which is refracted in the surface 40a and faces the side of the air 601. In addition, the interval (distance in the X direction) between the display area E1 and the side surface 40-4 (the outer edge of the counter substrate 40) is L2.

A dot P in the drawing is a point of the intersection between the edge of the surface 40a along the X direction and the edge of the side surface 40-4 along the Y direction. A thick two-dot chain line in the drawing is an assumed line acquired when it is assumed that the side surface 40-4 is moved to the side of the X direction. In addition, the interval between the side surface 40-4 (side surfaces 40-1, 40-2, 40-3, and 40-4) and the display area E1 is L2.

Hereinafter, the interval L2 between the side surface 40-4 (side surfaces 40-1, 40-2, 40-3, and 40-4) and the display area E1 is called the frame width L2 of the counter substrate 40.

As shown in FIG. 8, the incident light LB1, in which the angle based on the Z direction is γ, passes through the dot P of the surface 40a and is ejected to the side of the air 601 as the refracted light LB2 in which the angle based on the Z direction is β.

Meanwhile, the refracted light LB2, in which the angle based on the Z direction is β, is the display light which is ejected to the side of the air 601 from the dot P of the surface 40a, and is an example of the "display light in which the angle based on the normal vector direction is β" in the invention. The incident light LB1, in which the angle based on the Z direction is γ, is an example of the "light which is emitted from the light emitting elements and becomes the display light in which the angle based on the normal vector direction is β" in the invention.

In the organic EL device 100, the refracted light LB2, in which angle based on the Z direction is in a range of 0° to β, is used as the display light. In other words, in the organic EL device 100, when the display area E1 is viewed from a direction in which the angle based on the Z direction is in the range of 0° to β, it is possible to view a whole image.

Meanwhile, the angle β, generated between the progress direction of the refracted light LB2 and the Z direction, is an example of the "maximum value of the angle generated between the ejection direction of the display light and the normal vector direction of the second surface" in the invention.

With regard to the angle γ, generated between the progress direction of the incident light LB1 and the Z direction, and the angle β, generated between the progress direction of the refracted light LB2 and the Z direction, the relationship of Expression (13) described below is realized based on Snell's law.

$$n1 \sin \gamma = n2 \sin \beta \tag{13}$$

Accordingly, it is possible to acquire the angle γ, generated between the progress direction of the incident light LB1 and the Z direction, using Expression (14) described below.

$$\gamma = \sin^{-1}((n2/n1)\sin \beta) \tag{14}$$

When it is assumed that the side surface 40-4 is arranged on the side of the X (+) direction compared to the state shown in FIG. 8, that is, when it is assumed that the side surface 40-4 is arranged in a position indicated by a thick two-dot chain line, the incident light LB1 (light LB1 which faces the dot P from the dot K), in which the angle based on the Z direction is γ, is shielded by the side surface 40-4 which is indicated by the thick two-dot chain line. Accordingly, when the display area E1 is viewed from a direction in which the angle based on the Z direction is β, some of the image is hidden by the side surface 40-4 which is indicated by the thick two-dot chain line, and thus it is difficult to view the entire image.

When the side surface 40-4 is in the state shown in FIG. 8 or when it is assumed that the side surface 40-4 is arranged on the side of the X (−) direction compared to the state shown in FIG. 8, the incident light LB1, in which the angle based on the Z direction is γ, is not blocked by the side surface 40-4 shown by the thick two-dot chain line. Accordingly, when the display area E1 is viewed from the direction, in which the angle based on the Z direction is β, it is possible to view the entire image.

The size of the side surface 40-4 in the Z direction (board thickness of the counter substrate 40) is L1 and the angle generated between the incident light LB1 and the Z direction is γ. Therefore, when the display area E1 is viewed from the direction, in which the angle based on the Z direction is in a range of 0° to β, it is preferable that the frame width L2 of the counter substrate 40 satisfy Expression (15) described below in order to view the entire image by the refracted light LB2 (display light).

$$L2 \geq L1 \tan \gamma \tag{15}$$

Meanwhile, when the frame width L2 of the counter substrate 40 is too large, it is not preferable from a point of view of miniaturization and a light weight of the organic EL device 100. Accordingly, it is preferable that the frame width L2 of the counter substrate 40, which enables the entire image to be viewed, be equal to or less than the length X3 of the longest line from among the lines which connect two dots of the circumference of the display area E1 or the length X3 of the longest line from among the lines which connect the circumference of the display area E1 while passing through the center CP of the display area E1.

Accordingly, when the frame width L2 of the counter substrate 40 satisfies Expression (16) described below and when the display area E1 is viewed from the direction in which the angle based on the Z direction is in the range of 0° to β, it is possible to view the entire image.

$$L1 \tan \gamma \leq L2 \leq X3 \tag{16}$$

As described above, in the organic EL device 100 according to the embodiment, it is possible to acquire the advantages described below.

1) The organic EL device 100 according to the embodiment satisfies Expression (10) and Expression (3) described below.

$$X1/(2 \tan \alpha) \leq L1 \leq X3/(\tan \alpha) \tag{10}$$

$$\alpha = \sin^{-1}(n2/n1) \tag{3}$$

When Expression (10) and Expression (3) are satisfied, the reflected light LB3, which is reflected in the surface 40a, is incident to the second reflection layer 25b which is arranged in the non-display area E2 and is reflected in the second reflection layer 25b. Therefore, it is difficult for the reflected light LB3 to be reflected in the side of the display area E1, and thus it is difficult for unnecessary display to be generated.

2) Since the light shielding layer 51 is arranged in at least a part of the second reflection layer 25b of the non-display area E2, it is difficult for the reflected light in the second reflection layer 25b of the non-display area E2 to progress to the side of the display area E1. Accordingly, compared to a case in which the light shielding layer 51 is not provided, it is further difficult for unnecessary display to be generated due to the reflected light in the second reflection layer 25b of the non-display area E2.

3) Since the light shielding layer 52 is arranged in at least a part of the side surfaces 40-1, 40-2, 40-3, and 40-4, the influence of the reflected light in the side surfaces 40-1, 40-2, 40-3, and 40-4 is suppressed compared to a case in which the light shielding layer 52 is not arranged, and thus it is further difficult for unnecessary display to be generated.

4) According to the advantages 1) to 3), unnecessary display due to light reflected in the reflection layer 25 (second reflection layer 25b) and the side surfaces 40-1, 40-2, 40-3, and 40-4 is suppressed, and thus it is possible to provide a high-quality display.

5) Since the frame width L2 of the counter substrate 40 satisfies Expression (16) and Expression (14) described below, it is possible to view the entire image when the display area E1 is viewed from the direction in which the angle based on the Z direction is in the range of 0° to β.

$$L1 \tan \gamma \leq L2 \leq X3 \tag{16}$$

$$\gamma = \sin^{-1}((n2 \sin \beta)/n1) \tag{14}$$

Second Embodiment

Electronic Apparatus

Figure 9:
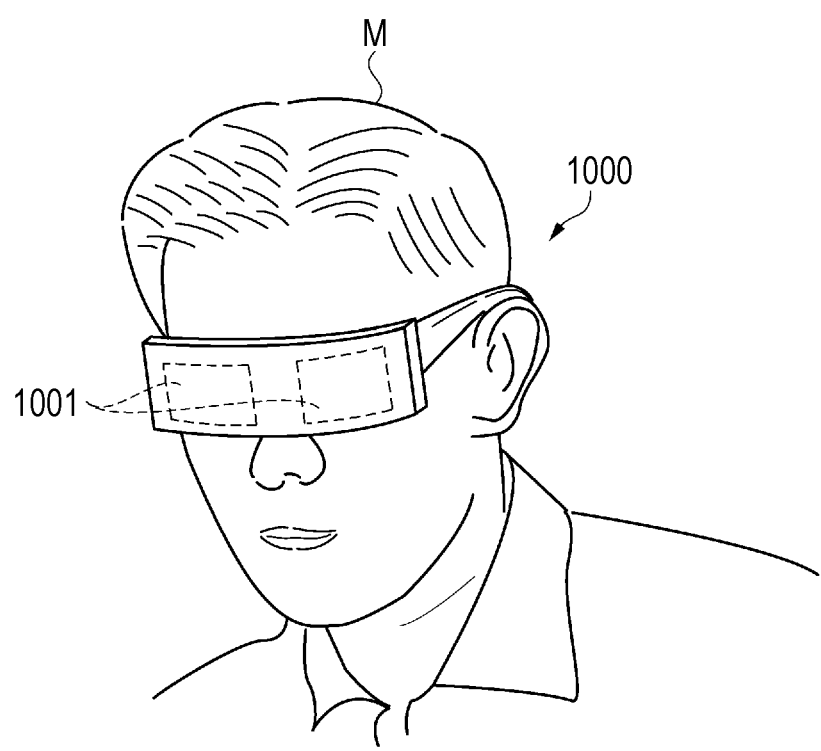
FIG. 9 is a schematic diagram illustrating a head mounted display.

FIG. 9 is a schematic diagram illustrating a head mounted display as an example of electronic apparatus.

As shown in FIG. 9, a head mounted display 1000 includes two display units 1001 which are provided to correspond to right and left eyes. An observer M can watch letters, images and the like which are displayed on the display units 1001 by mounting the head mounted display 1000 like glasses on the head area. For example, when images are displayed on the right and left display units 1001 while taking parallax into consideration, it is possible to watch and enjoy stereoscopic images.

The organic EL device 100 according to the embodiment is mounted on the display units 1001. In the organic EL device 100, unnecessary display due to the reflection of light in the reflection layer 25 and the side surfaces 40-1, 40-2, 40-3, and 40-4 is suppressed, and thus it is possible to provide a high-quality display. Accordingly, when the organic EL device 100 according to the embodiment is mounted on the display units 1001, it is possible to supply the head mounted display 1000 with high-quality display.

Meanwhile, electronic apparatus on which the organic EL device 100 according to the embodiment is mounted is not limited to the head mounted display 1000. For example, the organic EL device 100 may be mounted on electronic apparatus which includes a display unit, such as a head up display, the electronic view finder of a digital camera, a portable information terminal, or a navigator.

The invention is not limited to the embodiments and may be appropriately modified in a range which does not depart from the gist and sprit of the invention, which is read from claims and the whole specification. A display device, on which such modification is performed, and electronic apparatus, on which the display device is mounted, are also included in the technical scope of the invention.

Various modification examples may be taken into consideration in addition to the embodiments. Hereinafter, modification examples will be described.

First Modification Example

Figure 10:
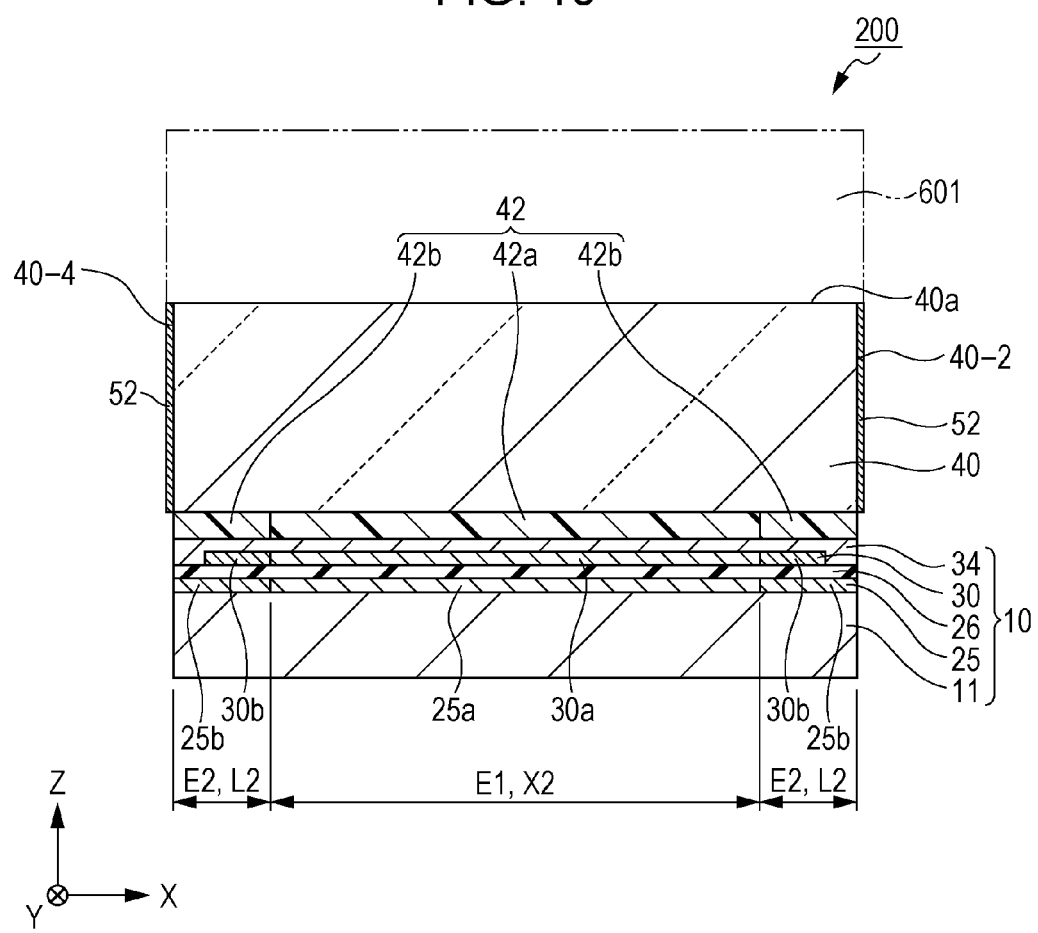
FIG. 10 is a schematic diagram illustrating the configuration of an organic EL device according to a first modification example.

FIG. 10 is a diagram corresponding to FIG. 5 and is a schematic cross-sectional diagram illustrating the configuration of an organic EL device according to a first modification example. In the organic EL device 200 according to the modification example, the light shielding layer 51 of the organic EL device 100 according to the first embodiment is omitted, and a resin layer (second resin layer 42b), which absorbs light in at least one position of the non-display area E2, is newly arranged. This is the difference between the modification example and the first embodiment.

As shown in FIG. 10, a resin layer 42, which is arranged between the element substrate 10 and the counter substrate 40, includes a first resin layer 42a which has transparency and a second resin layer 42b which has a light shielding property. The first resin layer 42a is arranged in the display area E1 and the second resin layer 42b is arranged in at least a part of the non-display area E2. The second resin layer 42b is a resin which absorbs light and is a resin in which, for example, black color materials (for example, pigments) are dispersed.

Since the resin (second resin layer 42b) which absorbs light in at least a part of the non-display area E2 is arranged between the element substrate 10 and the counter substrate 40, it is difficult for light, which is reflected in the second reflection layer 25b, to process to the side of the display area E compared to a case in which the second resin layer 42b is not arranged, and thus it is possible to further strongly suppress unnecessary display from being performed.

Second Modification Example

The surface 40a of the counter substrate 40 of the organic EL device according to the first modification example is covered by a material which has an refractive index smaller than the refractive index of the counter substrate 40, for example, magnesium fluoride.

As described above, a critical angle α, at which the incident light LB1 is totally reflected, is expressed using Expression (3) described below.

$$\alpha = \sin^{-1}(n2/n1) \tag{3}$$

Further, when the board thickness L1 of the counter substrate 40 satisfies Expression (7) described below, it is possible to cause the reflected light LB3 to be incident to the second reflection layer 25b.

$$L1 \geq X1/(2 \tan \alpha) \tag{7}$$

n1 is the refractive index of a medium which comes into contact with the air 601. In the first embodiment, n1 is the refractive index of the counter substrate 40 which comes into contact with the air 601. In the modification example, n1 is the refractive index of a material which has a refractive index smaller than the refractive index of the counter substrate 40 which comes into contact with the air 601. Accordingly, the refractive index n1 in Expression (3) according to the modification example is smaller than the refractive index n1 according to the first embodiment, and the critical angle α calculated in Expression (3) according to the modification example is greater than the critical angle α according to the first embodiment. Accordingly, the minimum value of the board thickness L1 of the counter substrate 40 calculated in Expression (7) according to the modification example is smaller than the minimum value of the board thickness L1 of the counter substrate 40 according to the first embodiment.

Accordingly, in the modification example, it is possible to reduce the minimum value of the board thickness L1 of the counter substrate 40 which can cause the reflected light LB3 to be incident to the non-display area E2 (second reflection layer 25b), compared to the first embodiment. That is, it is possible to realize the thin counter substrate 40.

Third Modification Example

The shape of the display area E1 may partially include a depression and a protrusion. Further, an edge, which forms the circumference of the polygonal display area E1, may partially include a curved line. Further, an edge, which forms the circumference of the polygonal display area E1 having a circular or elliptical shape, may partially include a straight line.

That is, when it is possible to regard the shape of the display area E1 as substantially a polygon, a circle, or an ellipse, the shape of the display area E1 is included in a technical scope to which the invention is applied.

The entire disclosure of Japanese Patent Application No.: 2014-033782, filed Feb. 25, 2014 is expressly incorporated by reference herein.

What is claimed is:

1. A display device comprising:
an element substrate that has a polygonal display area on which a plurality of light emitting elements are arranged and a non-display area disposed around an outside of the display area in plan view; and
a transparent substrate that faces the element substrate and includes a first surface which faces the element substrate, a second surface which is arranged on a side opposite to the first surface, and side surfaces which cross the first surface and the second surface,
wherein light, which is emitted from the light emitting elements, is ejected from the second surface as display light,
a shape of the display area is defined according to Expression (1):

$$X1/(2 \tan \alpha) \leq L1 \leq X3/(\tan \alpha) \qquad (1),$$

where a length of a shortest edge from among a plurality of edges configured to form a circumference of the shape of the display area is X1,
a length of a longest diagonal line from among a plurality of diagonal lines of the shape of the display area is X3,
a thickness of the transparent substrate is L1, and
a minimum value of an angle, which is generated between a progress direction of light emitted from the light emitting elements and a normal vector direction of the second surface when the light emitted from the light emitting elements is totally reflected in the second surface, is $\alpha$, and
the shape of the display area is configured to reflect light from the second surface so that the reflected light (i) faces a direction of the element substrate, (ii) is incident to the non-display area of the element substrate, and (iii) is reflected in the non-display area of the element substrate in order to suppress a display quality from being deteriorated.

2. A display device comprising:
an element substrate that has a circular or elliptical display area on which a plurality of light emitting elements are arranged and a non-display area disposed around an outside of the display area in plan view; and
a transparent substrate that faces the element substrate and includes a first surface which faces the element substrate, a second surface which is arranged on a side opposite to the first surface, and side surfaces which cross the first surface and the second surface,
wherein light, which is emitted from the light emitting elements, is ejected from the second surface as display light,
a shape of the display area is defined according to Expression (1):

$$X1/(2 \tan \alpha) \leq L1 \leq X3/(\tan \alpha) \qquad (1),$$

where a length of a shortest line from among a plurality of lines which connect a circumference of the display area while passing through a center of the display area is X1,
a length of a longest line from among a plurality of lines which connect the circumference of the display area while passing through the center of the display area is X3,
a thickness of the transparent substrate is L1, and
a minimum value of an angle, which is generated between a progress direction of light emitted from the light emitting elements and a normal vector direction of the second surface when the light emitted from the light emitting elements is totally reflected in the second surface, is $\alpha$,
the shape of the display area is configured to reflect light from the second surface so that the reflected light (i) faces a direction of the element substrate, (ii) is incident to the non-display area of the element substrate, and (iii) is reflected in the non-display area of the element substrate in order to suppress a display quality from being deteriorated.

3. The display device according to claim 1, wherein a film, which absorbs light, is arranged in at least a part of the side surfaces.

4. The display device according to claim 1, wherein a film, which absorbs light, is arranged in at least a part of a periphery of the display area on a surface which faces the transparent substrate of the element substrate.

5. The display device according to claim 1, wherein a resin, which absorbs light, is arranged in at least a part of a periphery of the display area between the element substrate and the transparent substrate.

6. The display device according to claim 1, wherein a refractive index of the transparent substrate is in a range of 1.2 to 1.6.

7. The display device according to claim 1, wherein the medium is air.

8. The display device according to claim 1, wherein the second surface is covered by a film which has a refractive index lower than the refractive index of the transparent substrate.

9. The display device according to claim 1, wherein the shape of the display area is further defined according to Expression (2) and Expression (3):

$$L1 \tan \gamma \leq L2 \leq X3 \qquad (2)$$

$$\gamma = \sin^{-1}((n2/n1)\sin \beta) \qquad (3),$$

where a maximum value of an angle generated between an ejection direction of the display light and the normal vector direction is $\beta$,
an angle generated between a progress direction of light, which is emitted from the light emitting elements as the display light when the angle based on the normal vector direction is $\beta$, and the normal vector direction is $\gamma$,
an interval between the display area and the side surfaces is L2,
a refraction index of the transparent substrate is n1, and
a refractive index of a medium which comes into contact with the second surface is n2.

10. The display device according to claim 1, wherein X3 is equal to or less than 25.4 mm.

11. An electronic apparatus comprising the display device according to claim 1.

12. An electronic apparatus comprising the display device according to claim 2.

13. An electronic apparatus comprising the display device according to claim 3.

14. An electronic apparatus comprising the display device according to claim 4.

15. An electronic apparatus comprising the display device according to claim 5.

16. An electronic apparatus comprising the display device according to claim 6.

17. An electronic apparatus comprising the display device according to claim 7.

18. An electronic apparatus comprising the display device according to claim 8.

19. An electronic apparatus comprising the display device according to claim 9.

20. An electronic apparatus comprising the display device according to claim 10.

21. The display device according to claim 1, wherein the shape of the display area is configured to prevent reflected light from reflecting in the display area.

* * * * *